(12) United States Patent
Brooks et al.

(10) Patent No.: US 6,891,734 B2
(45) Date of Patent: May 10, 2005

(54) KEYED FILLER PANEL WITH REMOVABLY-COUPLEABLE AIRFLOW RESISTIVE FILLER CARD ASSEMBLY

(75) Inventors: Michael A. Brooks, Sacramento, CA (US); Glenn C. Simon, Auburn, CA (US); Sean A. Cerniglia, Cool, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/094,248

(22) Filed: Mar. 7, 2002

(65) Prior Publication Data

US 2003/0169580 A1 Sep. 11, 2003

(51) Int. Cl.[7] .................................................. H05K 7/14
(52) U.S. Cl. ........................................ 361/800; 361/756
(58) Field of Search ................................ 361/683, 686, 361/753–759, 799–801, 825; 439/152, 327, 325, 135, 148

(56) References Cited

U.S. PATENT DOCUMENTS

| | | | | | |
|---|---|---|---|---|---|
| 4,334,261 A | * | 6/1982 | Gonzales | ..................... | 361/686 |
| 4,434,537 A | * | 3/1984 | Bean et al. | ..................... | 24/380 |
| 4,758,928 A | * | 7/1988 | Wierec et al. | ............... | 361/801 |
| 4,836,789 A | * | 6/1989 | Rudy et al. | .................... | 439/64 |
| 4,840,570 A | * | 6/1989 | Mann et al. | .................. | 439/74 |
| 5,319,524 A | * | 6/1994 | Welch et al. | ................ | 361/754 |
| 5,432,682 A | * | 7/1995 | Giehl et al. | ................. | 361/796 |
| 5,783,777 A | * | 7/1998 | Kruse et al. | ................... | 174/66 |
| 5,986,892 A | * | 11/1999 | Hargy, III | .................... | 361/759 |
| 6,181,565 B1 | * | 1/2001 | Schmitt et al. | ............. | 361/765 |
| 6,556,452 B2 | * | 4/2003 | Ruff | ........................... | 361/759 |

* cited by examiner

*Primary Examiner*—Kamand Cuneo
*Assistant Examiner*—Thanh S. Phan

(57) ABSTRACT

A keyed filler panel with removably-coupleable airflow resistive filler card assembly is disclosed. In one embodiment, the present invention is comprised of a filler panel body. The present embodiment is further comprised of an airflow resistive filler portion removably-coupleable with said filler panel body. The airflow resistive filler portion adapted to couple with the filler panel body without additional hardware.

21 Claims, 19 Drawing Sheets

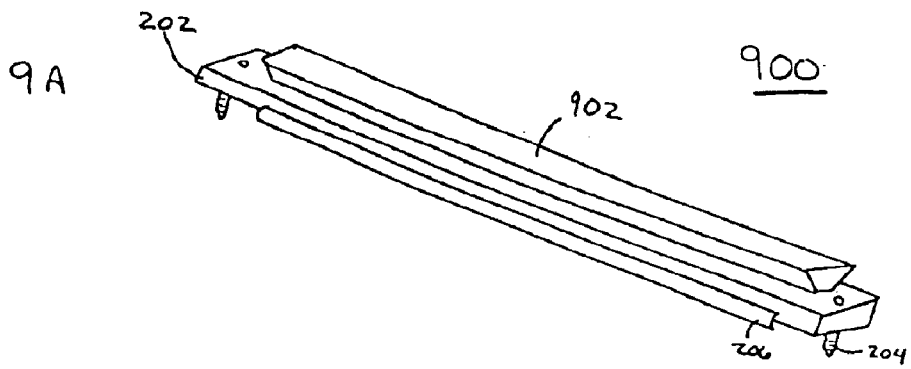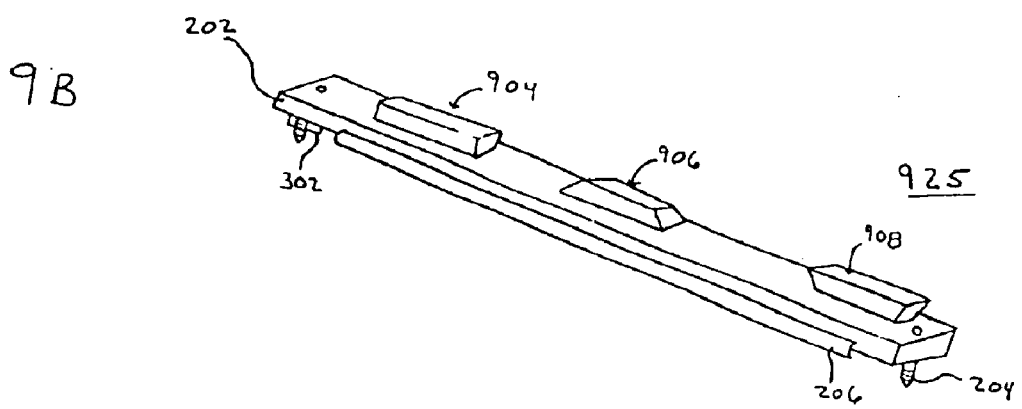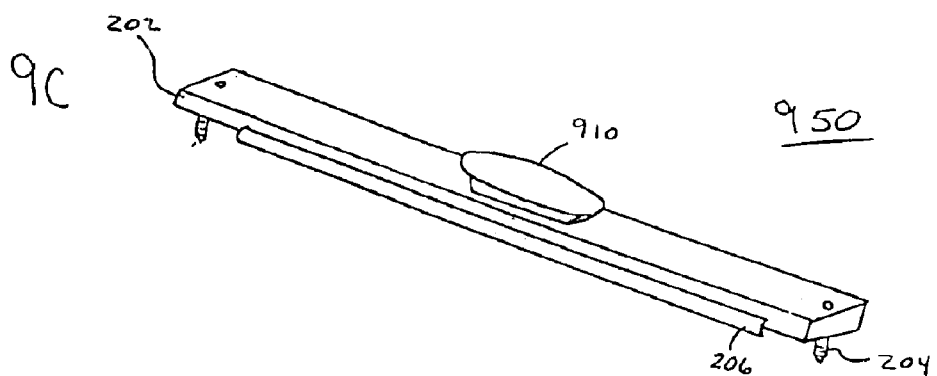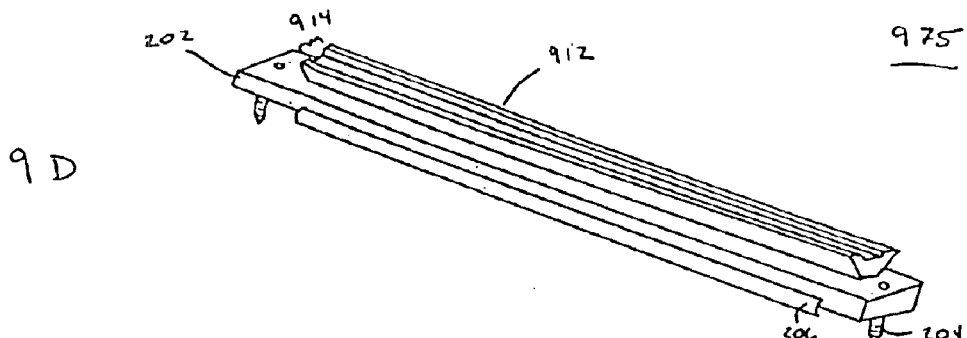
FIG 9A-D

SIDE VIEW 1500

FRONT VIEW 1530

SIDE VIEW 1600

FRONT VIEW 1625

KEYED FILLER PANEL WITH REMOVABLY-COUPLEABLE AIRFLOW RESISTIVE FILLER CARD ASSEMBLY

TECHNICAL FIELD

The present claimed invention relates to the field of chassis structures. More specifically, the present claimed invention relates to airflow resistive filler cards employed in conjunction with chassis structures.

BACKGROUND ART

In a bladed architecture environment, even airflow across a system is very important for the convective cooling of all blades in the system. Specifically, in a conventional computer chassis/card cage assembly, multiple slots are available to receive a corresponding printed circuit assembly (PCA). Cooling of the PCAs within the computer chassis/card cage assembly is usually performed by a system of fans set above and below the PCAs within the chassis, as opposed to each individual PCA maintaining its own fan. Therefore, it is imperative that the airflow throughout the system be uniform with respect to each PCA card to ensure proper cooling.

One problem with the fans being utilized in a convection fashion throughout the chassis is realized when a slot is empty. For example, an unpopulated (empty) slot creates a low-resistance passages that allows for undisturbed airflow. While, any adjoining populated (filled) slots have PCAs which act as high-resistance to the airflow. Therefore, the air will follow the path of least resistance and channel through the empty slot instead of passing through a filled slot. Thus, the job of cooling the components of the PCA is not accomplished. As a result, the reduction in the airflow between the PCAs may cause damage to the PCA cards through overheating.

At present one approach to fix the problem described above, is to add a mechanism, such as a blank PCA card, to the empty slot. The blank PCA card creates sufficient airflow resistance such that the airflow is evenly distributed throughout the system. However, one disadvantage of an added mechanism is user convenience. For example, if the user is required to add a mechanism to an empty slot each time a PCA card is removed, and the user forgets, the system will be deleteriously effected. Specifically, as previously stated, many PCAs may be damaged by the airflow channeling causing overheating of the system. In addition, the user may not realize a filler mechanism is required in the empty slot. It may also be the case that the user doesn't have a filler mechanism and thus the slot remains empty.

In addition to an airflow blocking mechanism being added to the empty slot to equalize the airflow of the system, a filler panel must also be coupled to the chassis. Conventionally, filler panels are used in conjunction with various computer chassis for electromagnetic interference (EMI) containment as well as for sealing of the computer chassis/card cage for thermal (e.g. forced airflow) cooling purposes. Specifically, in a conventional computer chassis/card cage assembly, multiple slots are available to receive a corresponding printed circuit assembly (PCA). The filler panels are attached to the computer chassis to enclose or seal off regions/slots of the computer chassis which do not have a printed circuit assembly (PCA) disposed therein. Typically, conventional filler panels are attached to the computer chassis using captive screws. The captive screws are disposed on the filler panels at locations corresponding to mounting holes residing within the computer chassis.

The location and the spacing of mounting holes within the computer chassis (and the corresponding location of the captive screws on the filler panels) are often defined by an industry standard. Typical standards include, for example, the compact peripheral component interconnect (CPCI) standard, and the VersaModular Eurocard (VME) standard. For example, the CPCI standard dictates that the gap between adjacent units (e.g. adjacent filler panels, adjacent PCAs, or a PCA and an adjacent filler panel) be nominally set at 0.30 millimeters. Unfortunately, industry standard captive screws allow the filler panel to be mispositioned by more than 1.0 millimeter. For purposes of the present application, this mispositioning with respect to the computer chassis, caused in some cases by the use of captive screws, is referred to as interference generating movement. During use, the interference generating movement of the filler panels can deleteriously prevent insertion of a PCA or a filler panel. That is, interference generating movement of one or more filler panels can result in insufficient space in a neighboring slot such that a filler panel or a PCA will not fit in the compromised gap.

At present, one approach to fix the problem described above, is to first have all of the necessary filler panels loosely connected to the computer chassis. Once all of the filler panels are in place, the filler panels are then carefully tightened to the computer chassis in order to insure that interference generating movement is reduced as much as possible. However, such a method is time-consuming, cumbersome, and lacks the desired "Design for Manufacturability (DFM)."

The problem described above is particularly egregious in light of the increased prevalence of "hot swapping." Hot swapping refers to a process in which a PCA is added to or removed from the computer chassis without powering down the system. With hot swapping, it is imperative that interference generating movement is reduced in order to facilitate rapid and perhaps frequent removal and addition of PCAs and filler panels.

One prior art attempt to resolve the problem of interference generating movement involves customizing a computer chassis with a non-standard sheet metal interface having predefined openings formed therein. Specially designed filler panels are also employed in conjunction with the non-standard customized computer chassis. Such an approach has severe drawbacks associated therewith. For example, a non-standard customized chassis allows DFM tolerancing that makes is very difficult to hold CPCI standard specifications. Furthermore, limiting customers to the use of one particular design/maker of filler panels is not favorable.

A further drawback is the mounting method for captive screws used in conjunction with filler panel assemblies. Specifically, as stated above, a filler panel mounted to a chassis is a tight fit. In fact, if captive screws are not utilized, ensuring a proper fit between the chassis and the filler panel is extremely difficult. In addition, since a filler panel is required for each slot not occupied with any type of complete assembly (i.e. any empty slot), on any given chassis, the number of empty slots can be extensive. As such, the multiplicity of required filler panels translates into a multiplicity of captive screw mounts. For example, a keyed filler panel assembly may include an attaching device comprised of a captive screw and an underlying D-clip.

It is appreciated that each underlying D-clip has an associated per item cost. It is further appreciated that a second cost is accrued with regard to assembly. Specifically, for every part required in the assembly operation, time and labor factors must be accounted for in the assembly process. That is, time and labor requirements translate into accrued costs. As a result, the associated costs of a filler panel assembly can deleteriously effect company profit.

A further problem has arisen with regard to the removal of filler panel assemblies. Specifically, as stated above, a filler panel mounted to a chassis is a tight fit. In fact, the EMI gasket causes a friction force which helps hold a filler panel in-place. Further, the face of the filler panel is smooth with nothing to grasp. Thus, with a multiplicity of filler panels or complete assemblies mounted on a chassis, removal of a single filler panel is both difficult and time consuming.

DISCLOSURE OF THE INVENTION

The present invention provides a method and apparatus for a keyed filler panel with removably-coupleable airflow resistive filler card assembly which reduces uneven airflow issues of empty PCA slots with respect to a chassis. The present invention also provides a method and apparatus for a keyed filler panel with removably-coupleable airflow resistive filler card assembly which reduces manufacturing and assembly costs. The present invention also provides a method and apparatus for a keyed filler panel with removably-coupleable airflow resistive filler card assembly which achieves the above accomplishment and which facilitates hot swapping of PCA cards. The present invention also provides a method and apparatus for a keyed filler panel with removably-coupleable airflow resistive filler card assembly which achieves the above accomplishments and which can be adapted to readily interface with industry standard components and meet industry standard specifications.

Specifically, a keyed filler panel with removably-coupleable airflow resistive filler card assembly is disclosed. In one embodiment, the present invention is comprised of a filler panel body. The present embodiment is further comprised of an airflow resistive filler portion removably-coupleable with said filler panel body. The airflow resistive filler portion adapted to couple with the filler panel body without additional hardware.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 9A is a perspective view of a keyed filler panel assembly with integrated handle in accordance with one embodiment of the present claimed invention.

FIG. 9B is a perspective view of another embodiment of a keyed filler panel assembly with integrated handle in which the attaching device is comprised of a captive screw and an underlying D-clip in accordance with one embodiment of the present claimed invention.

FIG. 9C is a perspective view of a keyed filler panel assembly with integrated handle in accordance with another embodiment of the present claimed invention.

FIG. 9D is a perspective view of another embodiment of a keyed filler panel assembly with integrated handle in which the integrated handle further comprises a recess in accordance with one embodiment of the present claimed invention.

The drawings referred to in this description should be understood as not being drawn to scale except if specifically noted.

BEST MODES FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. In other instances, well-known methods, procedures, components, and circuits have not been described in detail as not to unnecessarily obscure aspects of the present invention.

Airflow Resistive Filler Card Physical Characteristics

Figure 1A:
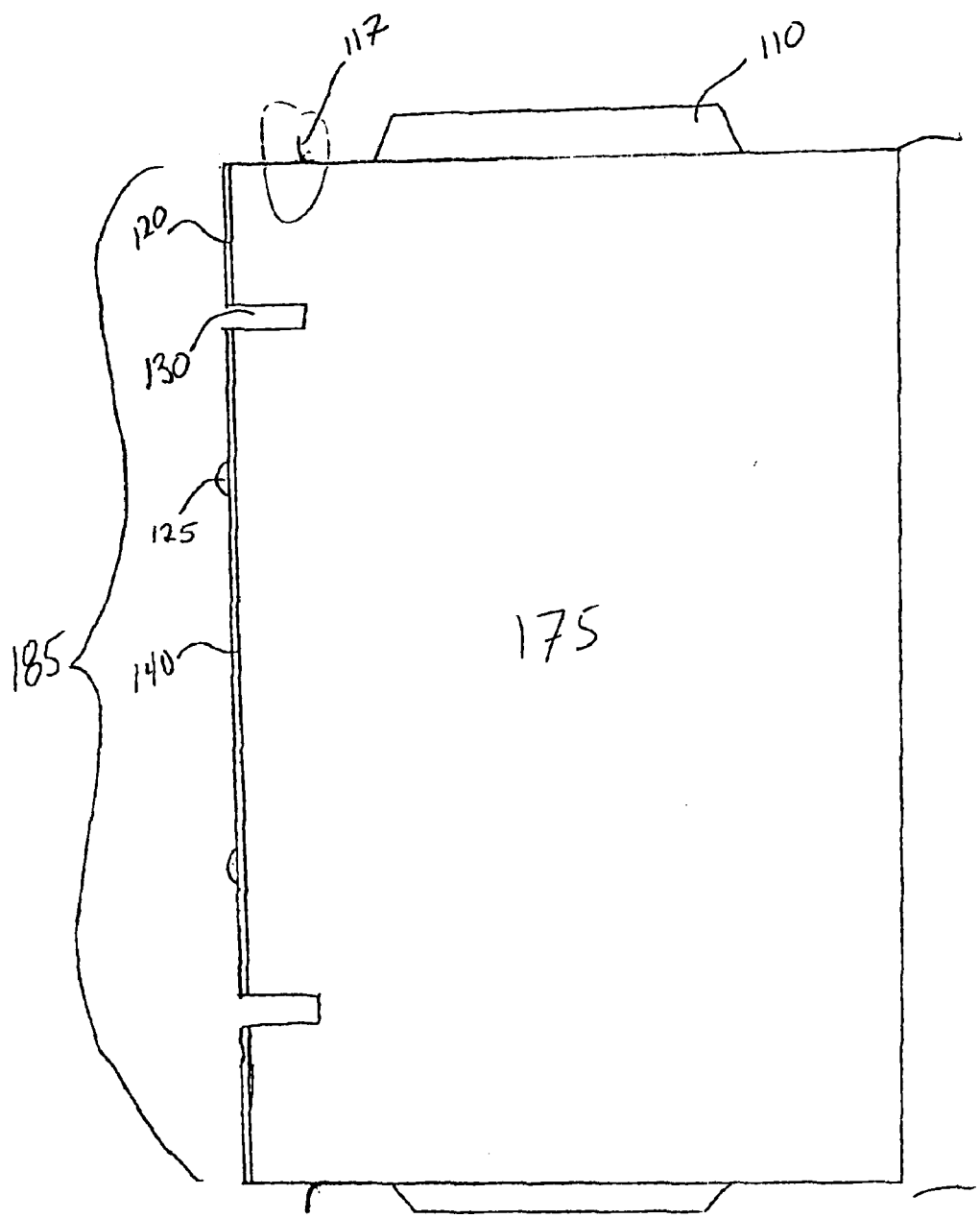
FIGS. 1A–1C are views of embodiments of keyed filler panels with removably-coupleable airflow resistive filler card assembly in accordance with one embodiment of the present claimed invention.
Figure 1B:
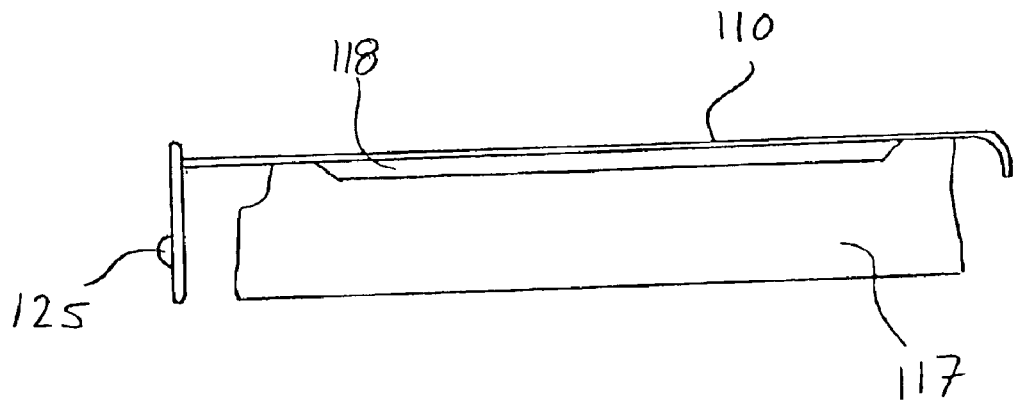
Figure 1C:
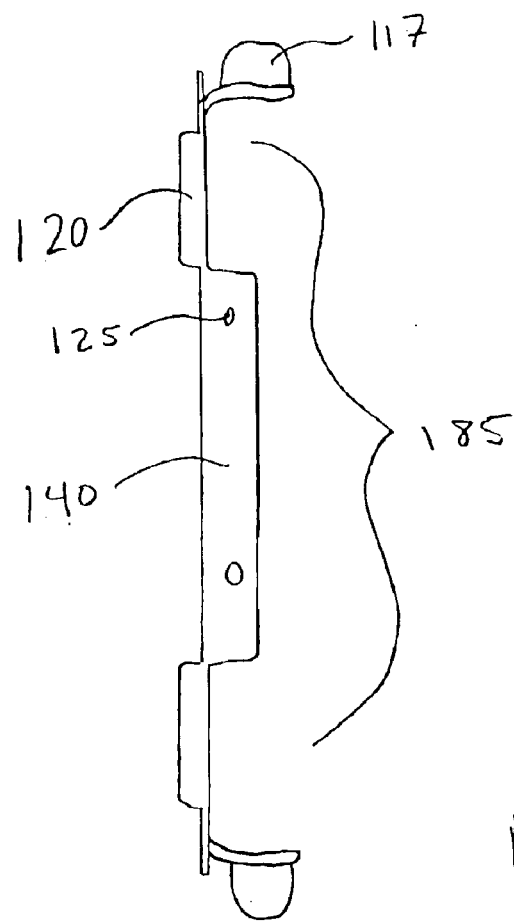

With reference now to FIGS. 1A–1C, views of airflow resistive filler card 150 in accordance with embodiments of the present claimed invention are shown. The following discussion will begin with a detailed description of the physical characteristics of the present airflow resistive filler card assembly. The discussion will then contain a detailed description of the use and operation of the airflow resistive filler card 150. In the present embodiment, airflow resistive filler card 150 includes a face portion 175 having a guide portion 110. Importantly, as will be discussed in detail herein, in one embodiment, face portion 175 in conjunction with guide portion 110 is formed having dimensions and characteristics which are in compliance with an industry standard such as, for example, the compact peripheral component interconnect (CPCI) standard, and the VersaModular Eurocard (VME) standard.

Referring still to FIGS. 1A–1C, airflow resistive filler card 150 also includes airflow blocker 117 which is fixedly coupled with airflow resistive filler card 150. Importantly, as will be discussed in detail herein, in one embodiment, airflow blocker 117 is formed having dimensions and characteristics which model the standard airflow resistance of a printed circuit assembly (PCA) card.

With reference still to FIGS. 1A–1C, airflow resistive filler card 150 also includes connective portion 185 which is fixedly coupled with airflow resistive filler card 150. In one embodiment, connective portion 185 is comprised of tab 120, punch detail 125, slot 130, and lip 140. Connective portion 185 is employed to removably couple airflow resistive filler card 150 with a filler panel body 202 of FIG. 2.

Figure 2A:
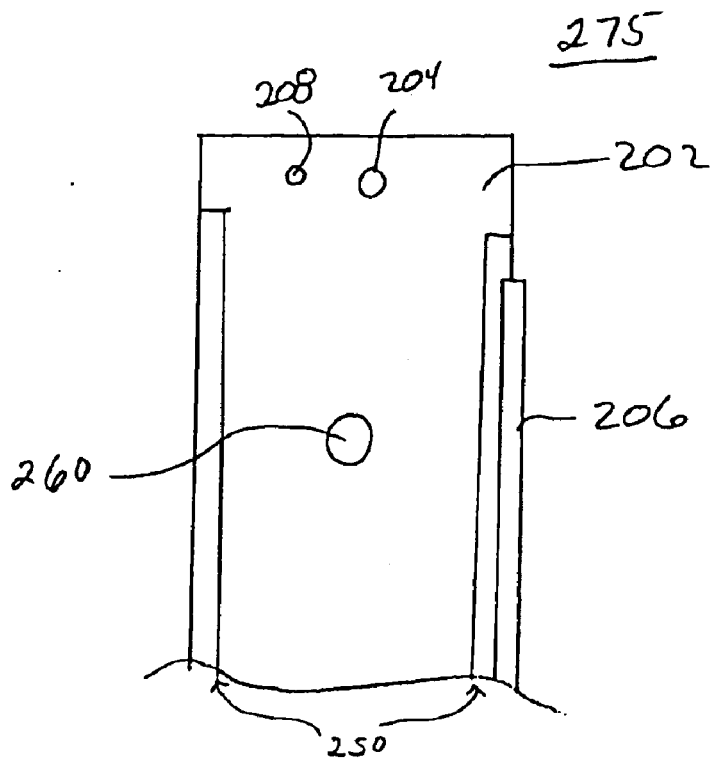
FIGS. 2A–2B are views of keyed filler panel assemblies in accordance with embodiment of the present claimed invention.
Figure 2B:
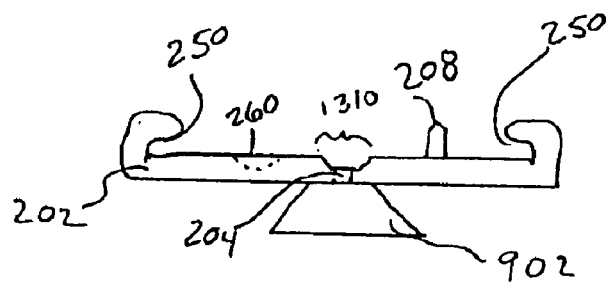

With reference now to FIGS. 2A–2B, views of keyed filler panel assembly 275 in accordance with embodiments of the present claimed invention are shown. In the present embodiment keyed filler panel assembly 275 includes a filler panel body 202. Importantly, as will be discussed in detail below, in one embodiment, filler panel body 202 is a filler panel formed having dimensions and characteristics which are in compliance with an industry standard such as, for example, the compact peripheral component interconnect (CPCI) standard, and the VersaModular Eurocard (VME) standard.

Referring still to FIGS. 2A–2B, keyed filler panel assembly 275 also includes an attaching device 204 which is adapted to be coupled to filler panel body 202. In one embodiment, attaching device 204 is comprised of a captive screw. Attaching device 204 is ultimately employed for removably coupling filler panel body 202 to a computer chassis 100 (of FIG. 7). Importantly, as will be discussed in detail below, in one embodiment, attaching device 204 is an attaching device formed having dimensions and characteristics which are in compliance with an industry standard such as, for example, the CPCI standard, and the VME standard. For purposes of brevity and clarity each of the numerous possibilities of attaching devices 204 are not shown in the present Figures.

With reference again to FIGS. 2A–2B, keyed filler panel assembly 275 of the present embodiment also includes an electromagnetic interference (EMI) shield portion 206 coupled to filler panel body 202. EMI shield portion 206 is employed to prevent EMI leakage from a chassis 100 (of FIG. 7) to which keyed filler panel assembly 450 is ultimately coupled. In one embodiment, EMI shield portion 206 is removably coupleable to filler panel body 202. The present embodiment is also well suited to an embodiment in which EMI shield portion 206 is integral with filler panel body 202.

Figure 5A:
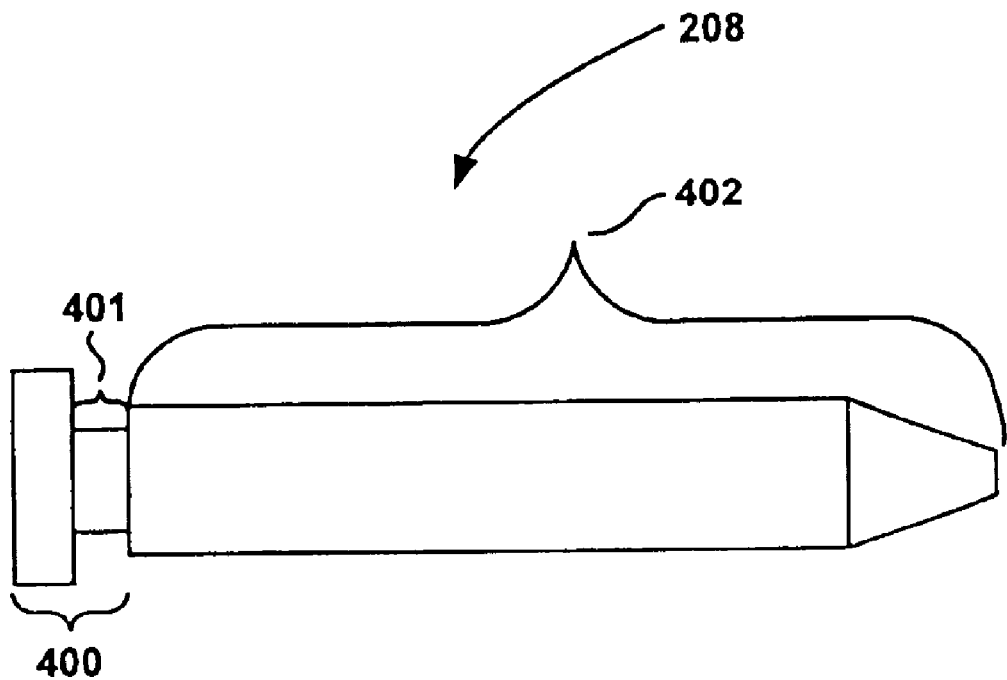
FIG. 5A–5B are side views of locating elements in accordance with embodiments of the present claimed invention.

Keyed filler panel assembly 275 of the present invention also includes a locating element 208 which is coupled to filler panel body 202. FIG. 5A shows a side view of one embodiment of locating element 208. As shown in FIG. 5A, in one embodiment, locating element 208 is comprised of a head portion 400, and an insertion portion 402. As will be discussed below in detail, in one embodiment, head portion 400 is adapted to be arranged flush with filler panel body 202 of FIG. 2. Insertion portion 402 of locating element 208 is adapted to be inserted in an opening (e.g. a mounting hole) in a computer chassis 100 (of FIG. 7) to reduce interference generating movement of filler panel body 202 of FIGS. 2 and 3 with respect to the computer chassis 100.

With reference still to FIGS. 2A–2B, keyed filler panel assembly 275 of the present invention also includes punch detail 260 and filler panel groove 250. As will be described in more detail herein, punch detail 260 is utilized in conjunction with punch detail 125 of FIGS. 1A–1C in order to reduce misalignment of connective portion 185 with respect to filler panel body 202. Additionally, filler panel groove 250 is a portion of keyed filler panel assembly 275 which is integral in coupling with airflow resistive filler card 150. Specifically, as will be described in detail below, connective portion 185 of FIGS. 1A–1C are removably-coupleable with groove 250 of FIGS. 2A–2B without additional hardware requirements.

Airflow Resistive Filler Card Use and Operation

The following is a detailed description of the use and operation of the present airflow resistive filler card assembly. With reference again to FIGS. 1A–1C, and 2A–2B, in one embodiment of the present invention, airflow resistive filler card 150 is utilized to simulate the airflow resistance of an actual PCA card found in a chassis 100 (of FIG. 7). Therefore, when convective circulation is utilized as the cooling method for the PCA cards within the chassis 100, empty slots are not deleteriously effecting the airflow. For example, in an air-cooled environment, it is important that all elements receive a similar amount of airflow in order to maintain the correct operating temperature. Any shortcomings in the airflow circulatory system may result in partial or complete overheating and breakdown of an element. However, since airflow follows the path of least resistance, if a slot is empty then an excessive amount of the cooling airflow will pass through the empty space causing possible system overheating for the rest of the PCAs.

With reference now to FIGS. 1A–1C, airflow resistive filler card 150 utilizes airflow blocker 117 to simulate the normal resistance found in a PCA. In addition, in one embodiment, as shown in FIG. 1B, a hole 118 is maintained between airflow blocker 117 and face portion 175. In general hole 118 allows an amount of air to flow through the slot equal to the amount that normally flows past a PCA. Therefore, airflow resistive filler card 150 further simulates a PCA.

With reference still to FIGS. 1A–1C, airflow resistive filler card 150 further comprises a guide portion 110.

Specifically, guide portion 110 is adapted to be coupled with respect to a chassis 100 such that interference movement of the airflow resistive filler card 150 with respect to chassis 100 is reduced. For example, guide portion 110 corresponds to an industry standard such as, for example, CPCI or VME.

With reference still to FIGS. 1A–1C, in one embodiment, connective portion 185 is coupled with airflow resistive filler card 150 at a location such that connective portion 185 will correspond to groove 250 and punch detail 260 of FIGS. 2A–2B. That is, in one such embodiment, connective portion 185 is rigidly coupled with face portion 175 at a location such that tab portion 120, and lip portion 140 will subsequently engage groove 250 of FIG. 2A–2B and, in so doing, firmly retain airflow resistive filler card 150 at a desired orientation with respect to the filler panel body 202 without additional hardware. As a result, subsequent to the insertion of airflow resistive filler card 150 into an opening in computer chassis 100 (of FIG. 7), the present embodiment allows airflow resistive filler card 150 to be coupled to filler panel body 202 without concern for deleterious interference generating movement.

Furthermore, in one embodiment of the present invention, punch detail 125 of FIGS. 1A–1C, aligns with punch detail 260 of FIGS. 2A–2B at a location which corresponds to an industry standard such as, for example, the compact peripheral component interconnect (CPCI) standard or the VersaModular Eurocard (VME) standard. In such an embodiment, punch detail 125 of FIGS. 1A–1C is rigidly coupled with lip 140 at a location such that punch detail 125 will subsequently engage an opening (e.g., punch detail 260) in a filler panel body 202 and, in so doing, firmly retain airflow resistive filler card 150 at an orientation such that, upon insertion into chassis 100 (of FIG. 7), the correct amount of airflow will be blocked to simulate an actual PCA card.

With reference still to FIG. 1A–1C, connective portion 185 comprises tab 120, slot 130, punch detail 125, and lip portion 140. In one embodiment, airflow resistive filler card 150 comprises two tabs 120, two slots 130, and one lip 140. Although two tabs 120, two slots 130, and one lip 140 are shown, the present invention is well suited to more or less tabs 120 and lips 140. The present number of tabs and lips are shown as one example of the plurality of possible tab/lip combinations. In addition, in one embodiment, slot 130 is utilized to allow side to side movement of tab 120. Therefore, in the present embodiment, one way to couple airflow resistive filler card 150 with filler panel 202 of FIG. 2A–2B, is to press the tabs 120 inward until both tab 120 and lip 140 are inside and coupled with groove 250. Then both tabs 120 are released and airflow resistive filler card 150 is firmly coupled in place with filler panel body 202.

In addition, in order to ensure that airflow resistive filler card 150 is coupled in the correct location with respect to filler panel body 202, in one embodiment, punch detail 125 of FIGS. 1A–1C are aligned with punch detail 260 of FIGS. 2A–2B. In one embodiment, as shown in FIGS. 1A–1B, punch detail 125 sticks out of lip 140. Furthermore, as shown in FIGS. 2A–2B, punch detail 260 is an indent in filler panel body 202. Thus, alignment of both punch details (e.g., 125, and 260) is accomplished when punch detail 125 fills in punch detail 260. Although a specific orientation is shown in the present embodiment, the present invention is well suited to other systems of alignment, such as punch detail 125 being an indent and punch detail 260 sticking out. In addition, although the present embodiment shows the punch details (e.g., 125 and 260) as being round, they may be any shape which facilitates alignment. The use of circles for the present embodiment is merely for purposes of brevity and clarity. Furthermore, any number of punch details may be used by the present invention, two are used merely as an example of any plurality of possibilities.

With reference still to FIGS. 1A–1C, airflow resistive filler card 150 may be made from any metal, such as aluminum, tin, steel, etc., which may be configured to the CPCI or VME standard.

With reference now to FIGS. 2A–2B, a filler panel assembly 275 is shown. In one embodiment, filler panel assembly 275 is comprised of filler panel body 202, attaching device 204, locating element 208, EMI portion 206, punch details 260, and groove 250. Filler panel body 202, attaching device 204, locating element 208, and EMI portion 206 are described in more detail below. With respect to punch detail 260, as described herein, one is shown in the present embodiment merely for purposes of clarity. That is, since only a portion of filler panel assembly 275 is shown, any other punch details 260 are not shown. However, the present invention is well suited to having a plurality of punch details 260. In addition, although the present embodiment shows groove 250 traversing the entire length of filler panel body 202, the present invention is well suited to only a portion of filler panel body 202 having groove 250. Furthermore, the present invention is well suited to having more than one set of grooves 250. Only one groove 250 is shown in the present embodiment merely for purposes of brevity and clarity.

Figure 3:
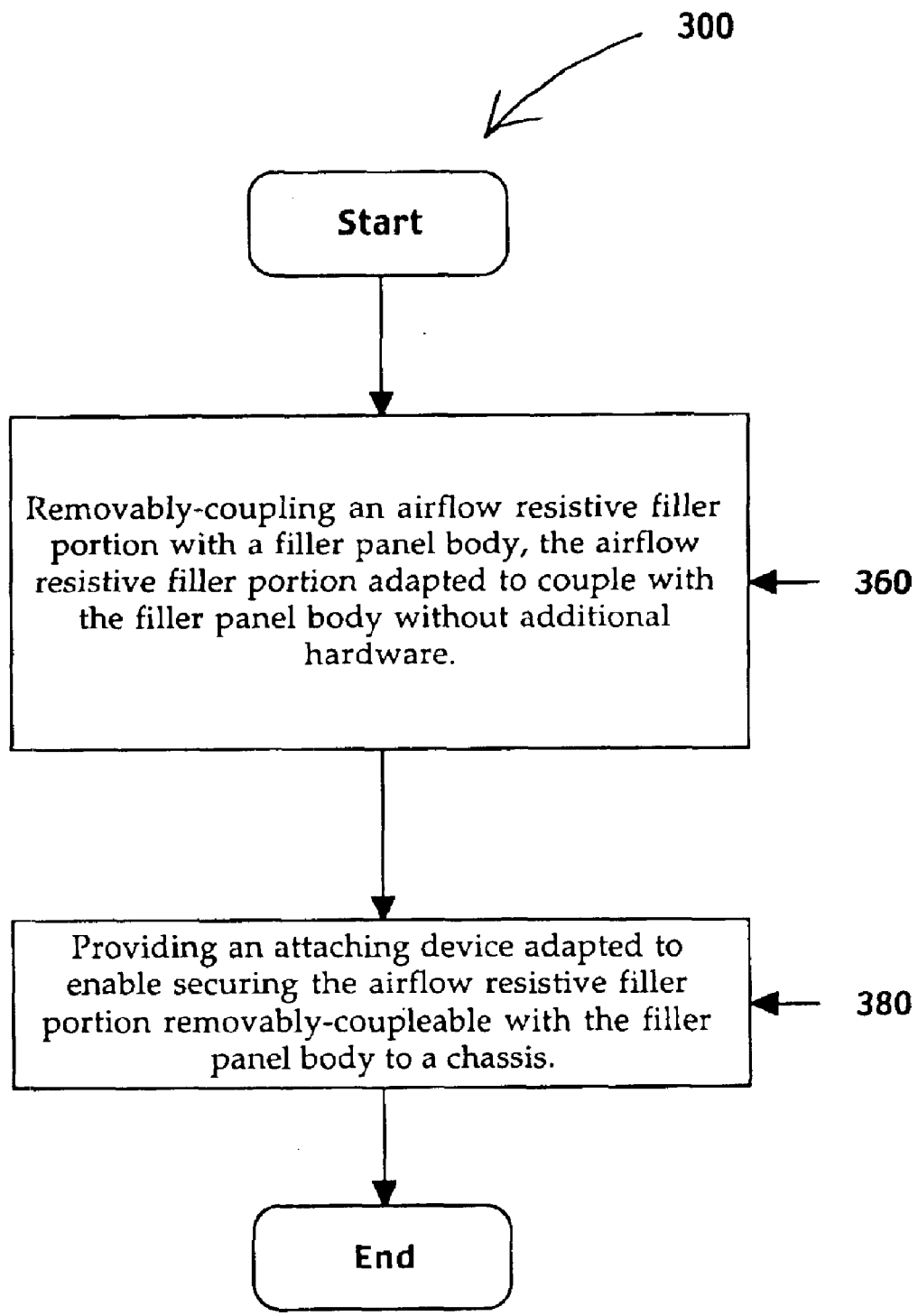
FIG. 3 is a flow chart of steps performed in accordance with one embodiment of the present claimed invention.

With reference now to FIG. 3, a Flowchart 300 summarizing the steps performed in accordance with one embodiment of the present invention is shown. At step 360, the present embodiment removably-couples an airflow resistive filler portion with a filler panel body 202 without additional hardware. As described in detail herein, the airflow resistive filler portion (e.g., airflow resistive filler card 150) removably-coupled with the filler panel body 202 is adapted to reduce uneven airflow with respect to computer chassis 100 (of FIG. 7).

Next, at step 380, the present embodiment provides an attaching device adapted to enable securing of the airflow resistive filler portion (e.g., airflow resistive filler card 150) removably-coupled with filler panel (e.g., filler panel 202) to the computer chassis 100. Beneficially, the present embodiment eliminates the need for additional hardware to couple airflow resistive filler card 150 with filler panel body 202. Instead, the present embodiment allows airflow resistive filler cards to be independently coupled with filler panel bodies without concern for any additional tools. Thus, the present embodiment achieves a "design for manufacturability" lacking in the prior art. Additionally, by enabling efficient alignment and coupling with the filler panel body, the present invention is well suited to use in hot swapping environments.

The previously mentioned filler panel with removably-coupleable airflow resistive filler card assembly is well suited to operation with or without some of the following features including the following locating element embodiment. Additionally, the present invention is well suited for operation with the locating element and various other attachment enabling devices.

Locating Element Physical Characteristics

Figure 4:
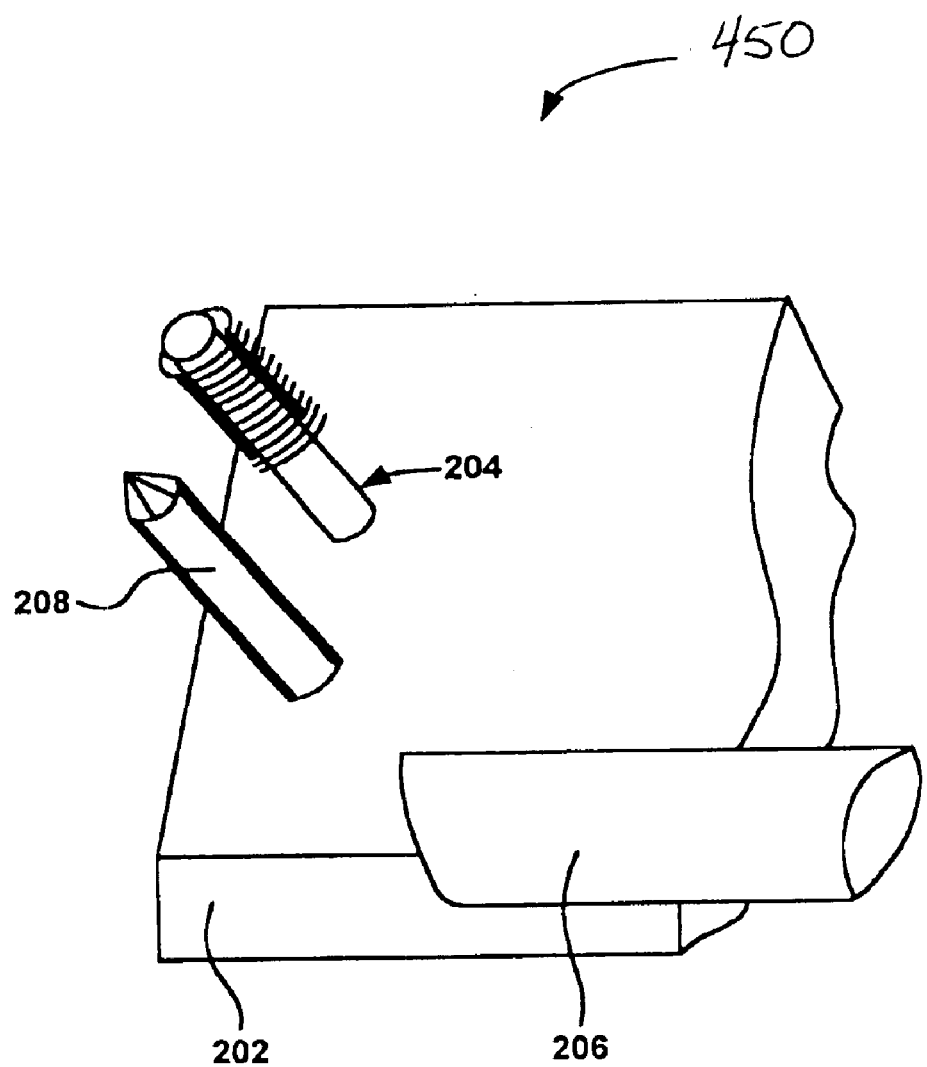
FIG. 4 is a perspective view of a keyed filler panel assembly in accordance with one embodiment of the present claimed invention.

With reference now to FIG. 4, a perspective view of a keyed filler panel assembly 450 in accordance with one embodiment of the present claimed invention is shown. The following discussion will begin with a detailed description of the physical characteristics of the present keyed filler panel assembly. The discussion will then contain a detailed description of the use and operation of the present keyed filler panel assembly. Regarding the physical structure of the present keyed filler panel assembly, for purposes of clarity, only one end of the keyed filler panel assembly 450 is shown in FIG. 4. In the present embodiment keyed filler panel assembly 450 includes a filler panel body 202. Importantly, as will be discussed in detail below, in one embodiment, filler panel body 202 is a filler panel formed having dimensions and characteristics which are in compliance with an industry standard such as, for example, the compact peripheral component interconnect (CPCI) standard, and the VersaModular Eurocard (VME) standard.

Referring still to FIG. 4, keyed filler panel assembly 450 also includes an attaching device 204 which is adapted to be coupled to filler panel body 202. In one embodiment, attaching device 204 is comprised of a captive screw. Attaching device 204 is ultimately employed for removably coupling filler panel body 202 to a computer chassis. Importantly, as will be discussed in detail below, in one embodiment, attaching device 204 is an attaching device formed having dimensions and characteristics which are in compliance with an industry standard such as, for example, the CPCI standard, and the VME standard. For purposes of brevity and clarity each of the numerous possibilities of attaching devices 204 are not shown in the present Figures.

With reference again to FIG. 4, keyed filler panel assembly 450 of the present embodiment also includes an electromagnetic interference (EMI) shield portion 206 coupled to filler panel body 202. EMI shield portion 206 is employed to prevent EMI leakage from a chassis to which keyed filler panel assembly 450 is ultimately coupled. In one embodiment, EMI shield portion 206 is removably coupleable to filler panel body 202. The present embodiment is also well suited to an embodiment in which EMI shield portion 206 is integral with filler panel body 202.

Figure 5B:
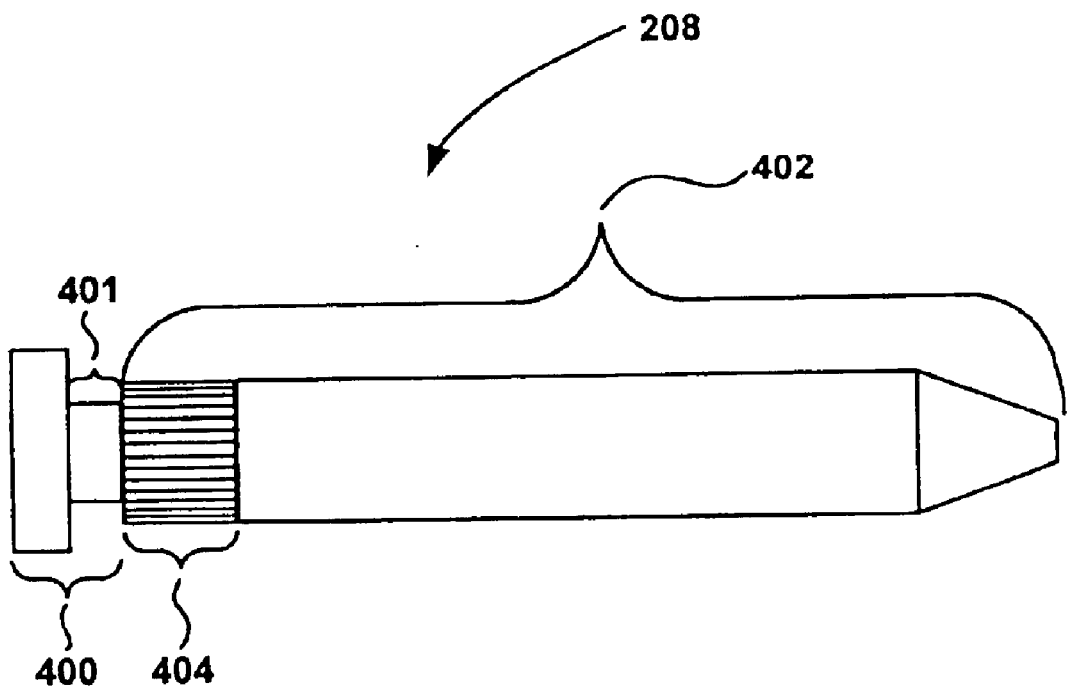

Keyed filler panel assembly 450 of the present invention also includes a locating element 208 which is coupled to filler panel body 202. FIG. 5A shows a side view of one embodiment of locating element 208. As shown in FIG. 5A, in one embodiment, locating element 208 is comprised of a head portion 400, and an insertion portion 402. As will be discussed below in detail, in one embodiment, head portion 400 is adapted to be arranged flush with filler panel body 202 of FIG. 4. Insertion portion 402 of locating element 208 is adapted to be inserted in an opening (e.g. a mounting hole) in a computer chassis to reduce interference generating movement of filler panel body 202 of FIG. 4 with respect to the computer chassis. FIG. 5B illustrates another embodiment of the present invention in which locating element 208 also includes a retention portion 404 which is coupled to head portion 400. Retention portion 404 is adapted to enhance coupling of locating element 208 and filler panel body 202 of FIG. 4. As will be described in detail below, locating element 208 is adapted to orient filler panel body 202 with respect to a computer chassis such that interference generating movement of filler panel body 202 is reduced.

Locating Element Use and Operation

The following is a detailed description of the use and operation of the present keyed filler panel assembly. With reference again to FIG. 4, in one embodiment of the present invention, locating element 208 is coupled to a filler body such as filler panel body 202. In one embodiment, locating element 208 is inserted through filler panel body 202 proximate to the location where attaching device 204 is or will be disposed. In the present embodiment, locating element 208 rigidly extends from filler panel body 202 and does not shift in position with respect to filler panel body 202.

Figure 6:
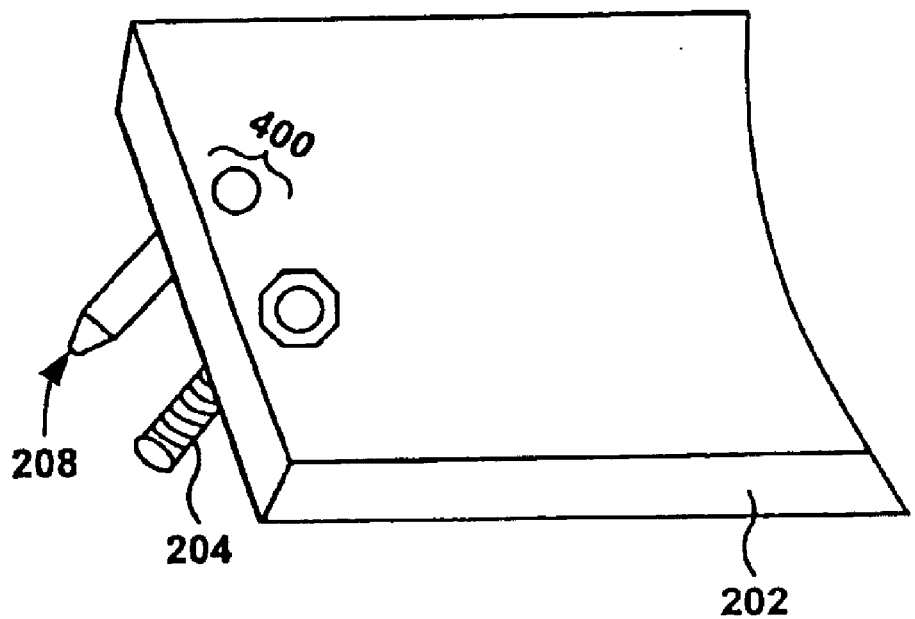
FIG. 6 is a perspective view of a keyed filler panel assembly in which the top surface of the head portion of a locating element is flush with the receiving surface of a filler panel body in accordance with one embodiment of the present claimed invention.

In one embodiment of the present invention, the locating element 208 is coupled to filler panel body 202 such that the top surface of head portion 400 is flush with the receiving surface of filler panel body 202. FIG. 6 illustrates an embodiment in which the top surface of head portion 400 is flush with the receiving surface of filler panel body 202. In one embodiment, the shape of head portion 400, including recessed region 401, assists in the coupling of locating element 208 to a filler panel body. Also, as shown in FIG. 5B, in one embodiment of the present invention, retention portion 404 is comprised, for example, of ridges which assist in the rigid attachment of locating element 208 to filler panel body 202 by "gripping" the surrounding material comprising filler panel body 202.

With reference again to FIG. 4, in one embodiment of the present invention, locating element 208 is coupled to filler panel body 202 at a location such that insertion portion 402 of FIGS. 5A and 5B of locating element 208 will correspond to mounting holes disposed on a computer chassis. That is, in one such embodiment, locating element 208 is rigidly coupled to filler panel body 202 at a location such that insertion portion 402 will subsequently engage an opening in a computer chassis and, in so doing, firmly retain filler panel body 202 at a desired orientation with respect to the computer chassis. As a result, subsequent to the insertion of locating element 208 into an opening in computer chassis, the present invention allows attaching device 204 to be coupled to the computer chassis without concern for deleterious interference generating movement.

Furthermore, in one embodiment of the present invention, locating element 208 is coupled to filler panel body 202 at a location which corresponds to an industry standard such as, for example, the compact peripheral component interconnect (CPCI) standard or the VersaModular Eurocard (VME) standard. In such an embodiment, locating element 208 is rigidly coupled to filler panel body 202 at a location such that insertion portion 402 will subsequently engage an opening (e.g. a mounting hole) in a computer chassis and, in so doing, firmly retain filler panel body 202 at an orientation such that the nominal spacing specified by the standard between an adjacent device (e.g. another filler panel or a PCA) is obtained.

Figure 7:
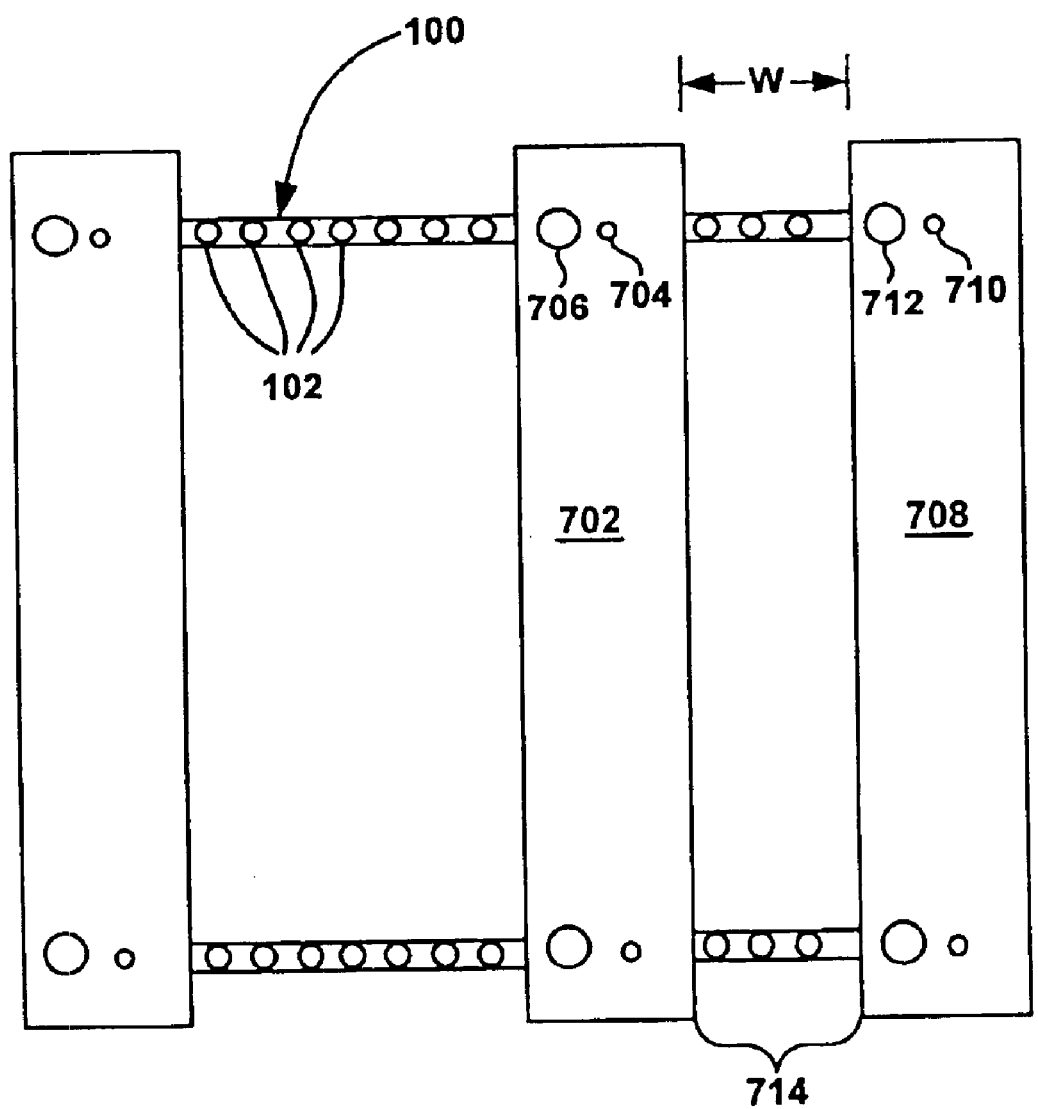
FIG. 7 is a front view of a plurality of keyed filler panel assemblies coupled to a computer chassis wherein interference generating movement has reduced in accordance with one embodiment of the present claimed invention.

With reference now to FIG. 7, an example of an embodiment in which the present invention obtains the nominal spacing specified by a standard between adjacent units is illustrated. As shown in FIG. 7, a portion of a computer chassis 100 is depicted having mounting holes, typically shown as 102, therein. For purposes of the present example, the spacing between mounting holes 102 is defined by the CPCI standard. A keyed filler panel assembly 702 is shown coupled to computer chassis 100 using locating element 704 and an attaching device 706 in accordance with one embodiment of the present invention. As a result, keyed filler panel assembly 702 is coupled to computer chassis 100 without any substantial interference generating movement. Another keyed filler panel assembly 708 is also shown coupled to computer chassis 100. In this example, keyed filler panel assembly 708 is also coupled to computer chassis 100 using a locating element 710 and an attaching device 712 in accordance with one embodiment of the present invention. As a result, keyed filler panel assembly 708 is also coupled to computer chassis 100 without any substantial interference generating movement. Because the present embodiment reduces interference generating movement of keyed filler panel assemblies 702 and 708, the width, W, of gap 714 is maintained at the nominal width allotted by the standard to accommodate the insertion of another filler panel or a PCA. Hence, the present embodiment eliminates the unwanted interference found in the prior art.

Figure 8:
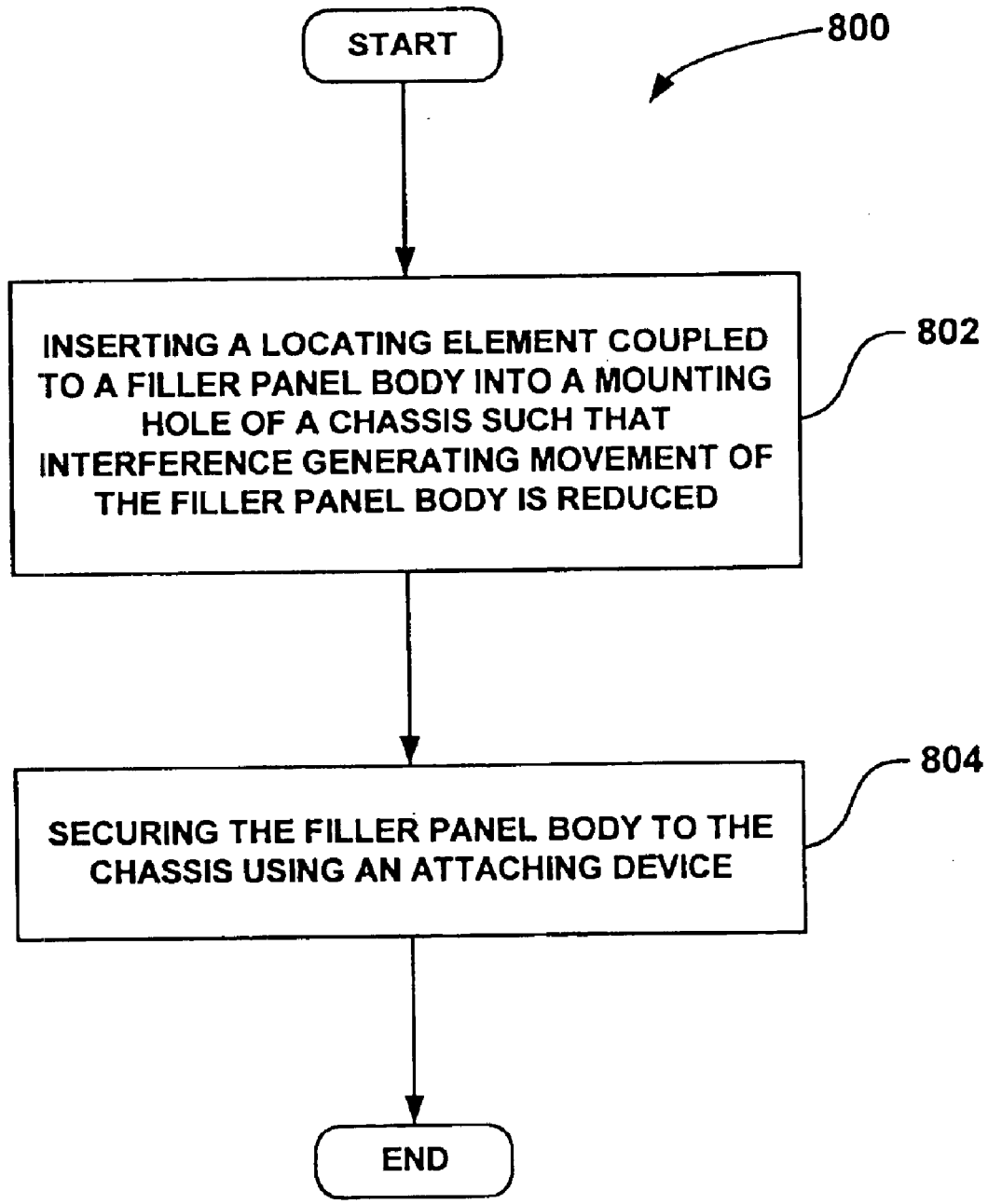
FIG. 8 is a flow chart of steps performed in accordance with one embodiment of the present claimed invention.

With reference now to FIG. 8, a flow chart 800 summarizing the steps performed in accordance with one embodiment of the present invention is shown. At step 802, the present embodiment inserts a locating element, coupled to a filler panel body, into a mounting hole of a chassis. As described in detail above, the locating element (e.g. locating element 208 of FIG. 4) is adapted to orient a filler panel body with respect to the computer chassis such that interference generating movement of the filler panel body is reduced.

Next, at step 804, the present embodiment then secures the filler panel body of the keyed filler panel assembly to the chassis using an attaching device (e.g. captive screw 204 of FIG. 4). Beneficially, the present embodiment eliminates the need to first have all of the necessary filler panels loosely connected to the computer chassis and then subsequently tighten the arranged filler panels. Instead, the present embodiment allows keyed filler panel assemblies to be independently coupled to a computer chassis at any time without concern for the subsequent attachment of additional filler panels or PCAs. Thus, the present invention achieves a "Design for Manufacturability" lacking in the prior art. Additionally, by reducing interference generating movement and enabling the independent attachment of keyed filler panel assemblies to a computer chassis, the present invention is extremely well suited to use in hot swapping environments.

The previously mentioned filler panel with removably-coupleable airflow resistive filler card assembly is well suited to operation with or without some of the following features including the following integrated handle embodiment. Additionally, the present invention is well suited to operation with the integrated handle and the previously described locating element or various other attachment enabling devices.

Integrated Handle Physical Characteristics

With reference now to FIGS. 9A–D, perspective views of keyed filler panel assemblies with integrated handles in accordance with embodiments of the present claimed invention are shown. The following discussion will begin with a detailed description of the physical characteristics of the present keyed filler panel assembly with integrated handle. The discussion will then contain a detailed description of the use and operation of the present keyed filler panel assembly with integrated handle. In the present embodiments, keyed filler panel assemblies 900, 925, 950, and 975 include integrated handles 902, 904, 906, 908, 910, and 912. Importantly, as will be discussed in detail below, in one embodiment, filler panel body 202 is a filler panel formed having dimensions and characteristics which are in compliance with an industry standard such as, for example, the compact peripheral component interconnect (CPCI) standard, and the VersaModular Eurocard (VME) standard.

Referring still to FIGS. 9A–D, keyed filler panel assemblies 900, 925, 950, and 975 also include and attaching device 204 which is adapted to be coupled to filler panel body 202. In one embodiment, attaching device 204 is comprised of a captive screw. Attaching device 204 is ultimately employed to removably couple filler panel body 202 to a computer chassis. Importantly, as will be discussed in detail below, in one embodiment, attaching device 204 is an attaching device formed having dimensions and characteristics which are in compliance with an industry standard such as, for example, the CPCI standard, and the VME standard. For purposes of brevity and clarity each of the numerous possibilities of attaching devices are not shown in the present Figures.

With reference again to FIGS. 9A–D, keyed filler panel assemblies 900, 925, 950, and 975 of the present embodiment also includes an electromagnetic interference (EMI) shield portion 206 coupled to filler panel body 202. EMI shield portion 206 is employed to prevent EMI leakage from a chassis to which keyed filler panel assemblies 900, 925, 950, and 975 are ultimately coupled. In one embodiment, EMI shield portion 206 is removably coupleable to filler panel body 202. The present embodiment is also well suited to an embodiment in which EMI shield portion 206 is integral with filler panel body 202.

Figure 10:
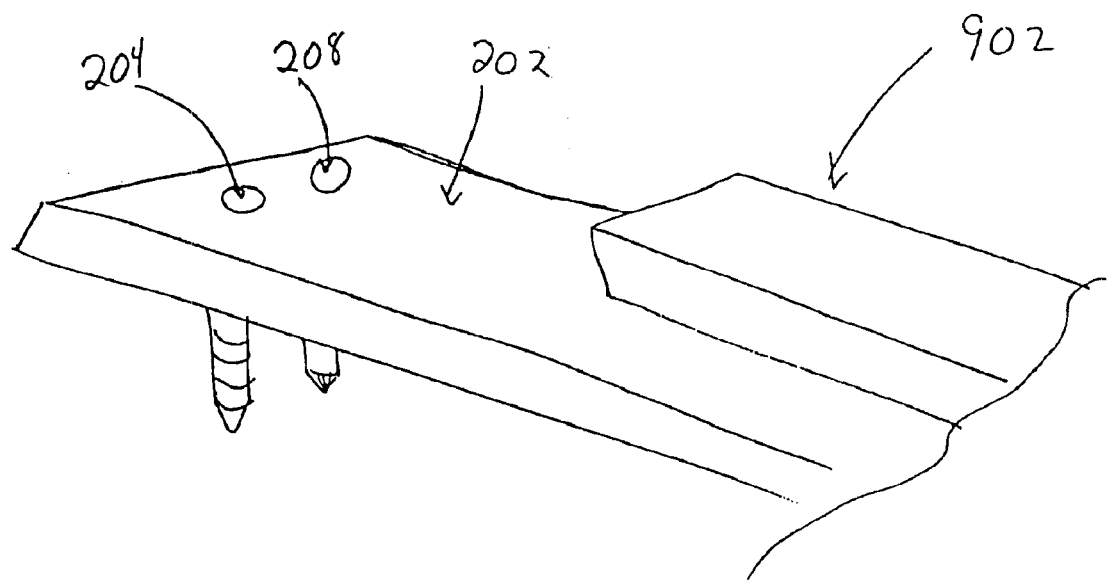
FIG. 10 is a perspective view of a keyed filler panel assembly with integrated handle in which the filler panel further comprises a locating element in accordance with one embodiment of the present claimed invention.

Keyed filler panel assembly 1000 of FIG. 10 also includes a locating element 208 which is coupled to filler panel body 202. FIG. 5A shows a side view of one embodiment of locating element 208. As shown in FIG. 5A, in one embodiment, locating element 208 is comprised of a head portion 400, and an insertion portion 402. As discussed in detail above, in one embodiment, head portion 400 is adapted to be arranged flush with filler panel body 202 of FIG. 10. Insertion portion 402 of locating element 208 is adapted to be inserted in an opening (e.g. a mounting hole) in a computer chassis to reduce interference generating movement of filler panel body 202 of FIG. 10 with respect to the computer chassis. FIG. 5B illustrates another embodiment in which locating element 208 also includes a retention portion 404 which is coupled to head portion 400. Retention portion 404 is adapted to enhance coupling of locating element 208 and filler panel body 202 of FIG. 10. As described in detail above, locating element 208 is adapted to orient filler panel body 202 with respect to a computer chassis such that interference generating movement of filler panel body 202 is reduced.

Integrated Handle Use and Operation

The following is a detailed description of the use and operation of the present keyed filler panel assembly with integrated handle. With reference to FIG. 9A, a handle element 902 is integral with filler panel body 202. In general, the filler panel body with integrated handle element is formed utilizing processes such as "extruding", "shaping", "casting", "molding", "machining", "milling", "welding", "sculpting", "compressing" or the like. Thus, in one embodiment, handle element 902 is fixedly coupled with filler panel body 202. Moreover, handle element 902 does not destructively interfere with attaching device 204 coupled with filler panel body 202. Generally speaking, handle element 902 is adapted to provide a grasping surface above filler panel body 202 such that removably coupling filler panel body 202 with respect to computer chassis 100 is simplified. Specifically, handle element 902 offers a protrusion which allows a user to obtain positive control of the keyed filler panel assembly 900. That is, by utilizing handle element 902, a user is able to easily decouple keyed filler panel assembly 900 from a computer chassis 100. Additionally, FIGS. 9A–C illustrate a multitude of possible integrated handle shapes (i.e. 902, 904, 906, 908, and 910) which may be utilized with keyed filler panel 202. Although, a specific variety of possible integrated handle shapes are shown, the illustrations are meant to be instructive not inclusive. Thus, it is appreciated that the present embodiment may incorporate multiple variations of integrated handle shapes within the scope of the present invention.

As is further illustrated in FIG. 9B, the present embodiment is capable of maintaining more than one integrated handle (e.g. 904, 906, and 908) upon a specific filler panel 202. Moreover, as illustrated in FIG. 9B, the integrated handles (e.g. 904, 906, and 908) may be different shapes and sizes. Similarly, as illustrated in FIG. 9C, a further embodiment may include only a single integrated handle 910 which is comparatively smaller in size than the filler panel 202 on which it is fixedly coupled. Furthermore, although FIG. 9C shows a comparatively smaller integrated handle 910 in the middle portion of filler panel 202, the present embodiment is more than capable of maintaining an integrated handle 910 at any location on filler panel 202. Therefore, although a multiplicity of integrated handles have been outlined in the above stated embodiments, for purposes of brevity and clarity each of the possible numerous possibilities of integrated handles are not shown in the present figures.

With reference now to integrated handles in general, and FIG. 9A in particular, in one embodiment handle element 902 is fixedly coupled with filler panel body 202 such that the base of handle element 902 is flush with the outer surface of filler panel body 202. Handle element 902 further comprises a head portion fixedly coupled with the base portion. Specifically, the head portion is disposed above the base portion in a manner which provides a grasping surface for removably coupling filler panel body 202 with respect to computer chassis 100. That is, the head portion of handle element 902 offers a gripping surface for a user thus simplifying the removal of keyed filler panel apparatus 900 from computer chassis 100. In addition, FIGS. 9B–D illustrate embodiments on which some of the bases of handle elements 904, 906, 908, and 910 are flush with filler panel body 202, and some are not. The present embodiment utilizes a base portion of handle element 902 which is flush with filler panel body 202 merely as one example.

Consequently, unlike prior art approaches which utilize a prying tool to remove and possibly damage a keyed filler panel assembly, the present embodiment allows a user to grasp integrated handle 902 in order to obtain a purchase on keyed filler panel assembly 900. In so doing, the extraction process of keyed filler panel assembly 900 with respect to computer chassis 100 is simplified. In a further embodiment, integrated handle 902 also allows a user to hold keyed filler panel assembly 900 in the proper position while coupling the filler panel with computer chassis 100.

With reference now to FIG. 9D, a recess portion 914 is illustrated within integrated handle 912. Specifically, recess portion 914 may be adapted to hold a label or other such item therein. It is appreciated that recess portion 914 may be utilized with any of the afore mentioned integrated handle types. Further, recess portion 914 may be used in more than one place on, or only on a portion of, any of the afore mentioned integrated handle types.

With reference now to FIG. 10, in one embodiment, locating element 208 is coupled to a filler panel body with integrated handle such as filler panel body 202. In one embodiment, locating element 208 is inserted through filler panel body 202 proximate to the location where attaching device 204 is or will be disposed. In the present embodiment, locating element 208 rigidly extends from filler panel body 202 and does not shift in position with respect to filler panel body 202.

In one embodiment, the locating element 208 is coupled to filler panel body 202 such that the top surface of locating element 208 is flush with the receiving surface of filler panel body 202. Specifically, FIG. 10 illustrates an embodiment in which the top surface of locating element 208 is flush with the receiving surface of filler panel body 202. In one embodiment, the shape of head portion 400, including recessed region 401, assists in the coupling of locating element 208 to a filler panel body. Also, as shown in FIG. 5B, in one embodiment, retention portion 404 is comprised, for example, of ridges which assist in the rigid attachment of locating element 208 to filler panel body 202 by "gripping" the surrounding material comprising filler panel body 202.

Figure 11:
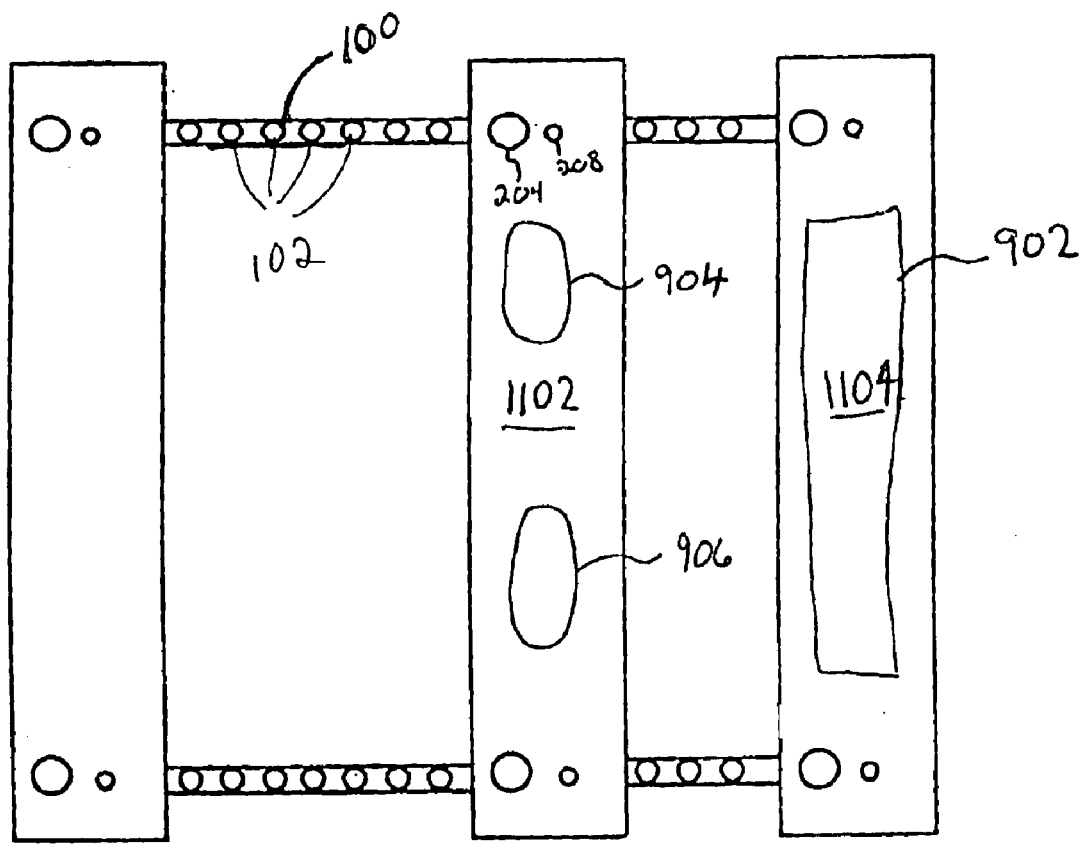
FIG. 11 is a front view of a plurality of keyed filler panel assemblies coupled to a computer chassis wherein removal coupling of a filler panel body with respect to a chassis is simplified in accordance with one embodiment of the present claimed invention.

With reference now to FIG. 11, an example of an embodiment in which a keyed filler panel assembly is removably coupled with a computer chassis 100 is illustrated. As shown in FIG. 11, a portion of a computer chassis 100 is depicted having mounting holes, typically shown as 102, therein. For purposes of the present example, the spacing between mounting holes 102 is defined by the CPCI standard. Keyed filler panel assembly 1102 is shown coupled to computer chassis 100 using locating element 206 and an attaching device 204. Keyed filler panel assembly 1102 further comprises, for example, integrated handles 904, and 906 in accordance with one embodiment. As a result, keyed filler panel assembly 1102 may be decoupled from computer chassis 100 without any prying and much less difficulty. Another keyed filler panel assembly 1104 is also shown coupled to computer chassis 100. In this example, keyed filler panel assembly 1104 comprises a single integrated handle 902. As a result, keyed filler panel assembly 1104 may also be decoupled from computer chassis 100 without any prying and much less difficulty. Because the present embodiment reduces the difficulty of decoupling the filler panel 202 from a computer chassis 100, no prying or additional parts are required. Hence, the present embodiment eliminates the unwanted costs and labor found in the prior art.

Figure 12:
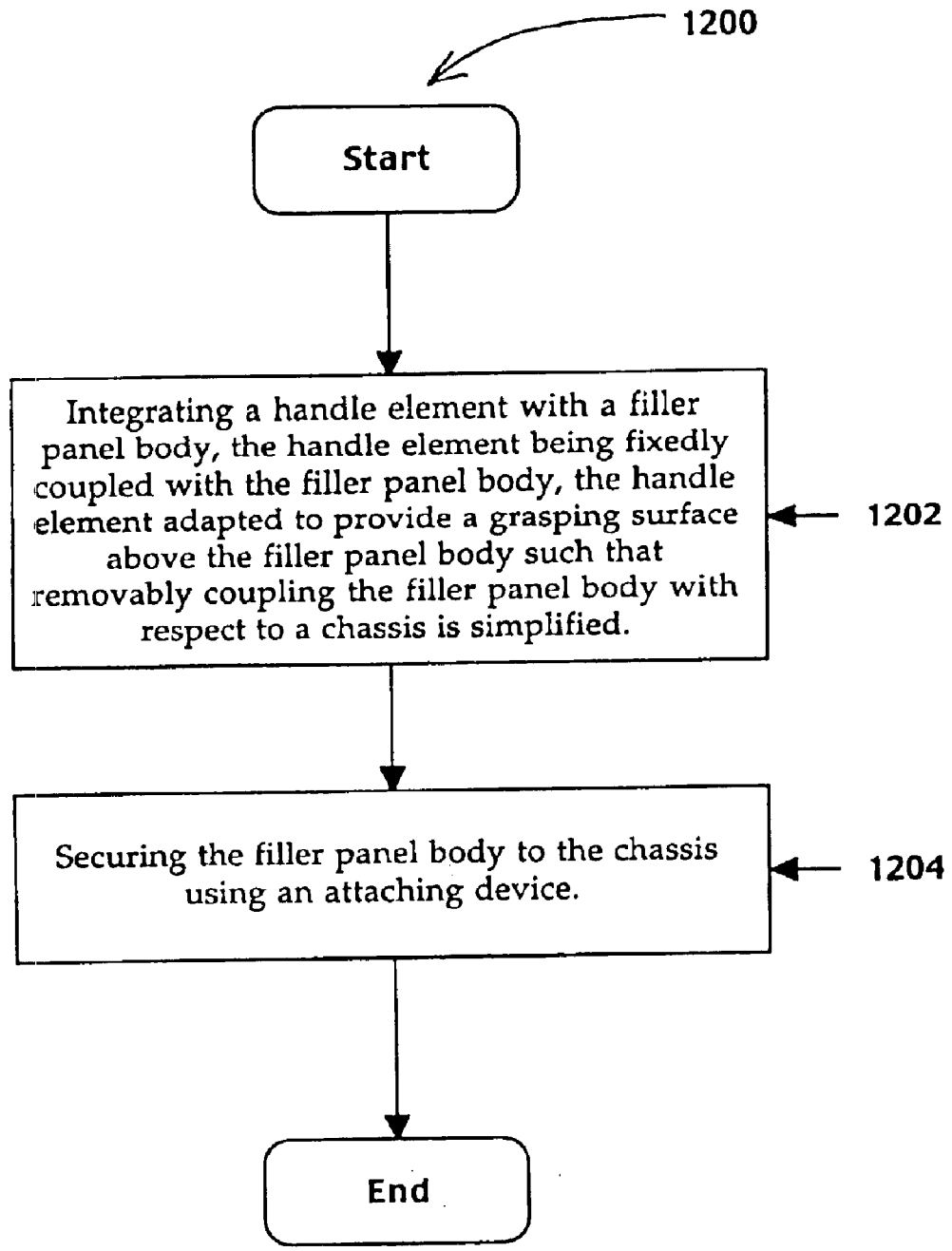
FIG. 12 is a flow chart of steps performed in accordance with one embodiment of the present claimed invention.
Figure 13A:
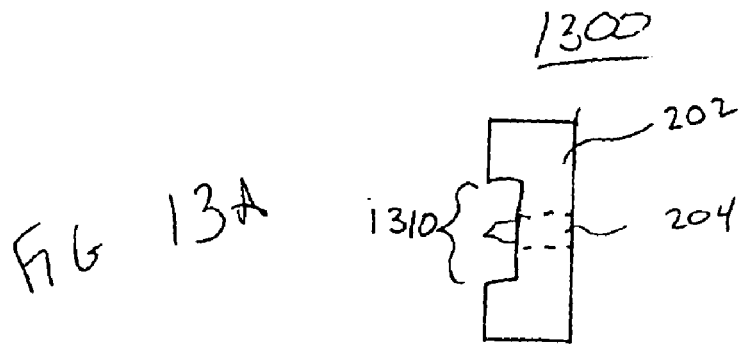
FIGS. 13A–D are views of embodiments of keyed filler panel assemblies with integrated recessed regions in accordance with embodiments of the present claimed invention.
Figure 13B:
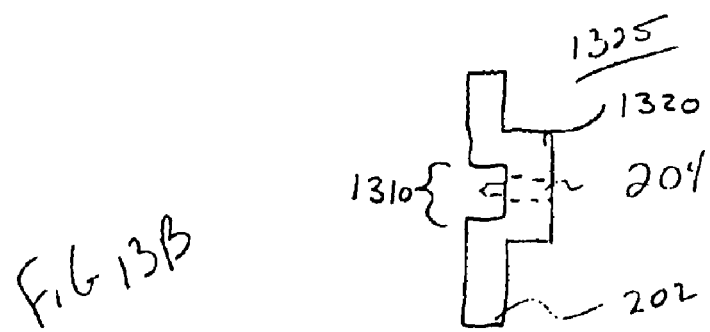
Figure 13C:
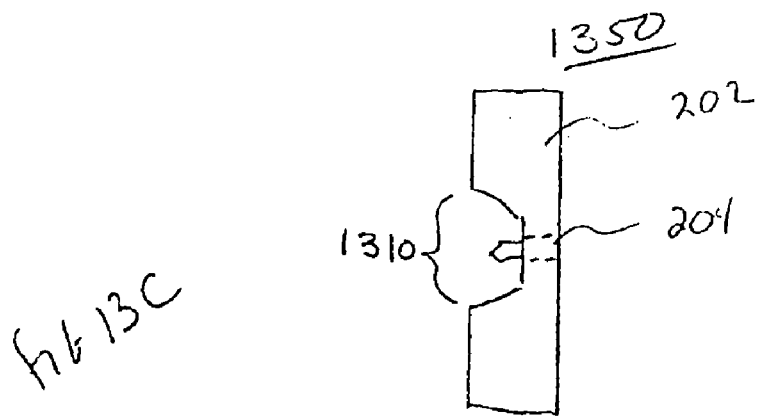
Figure 13D:
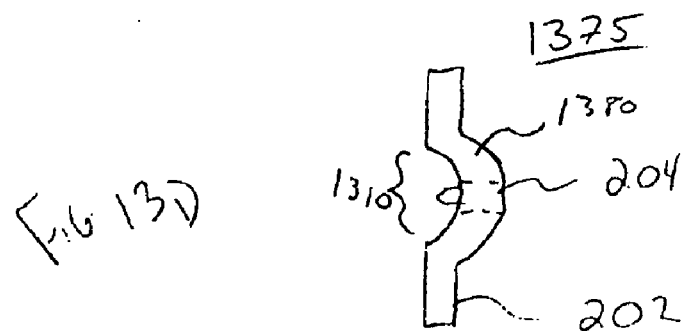
Figure 14A:
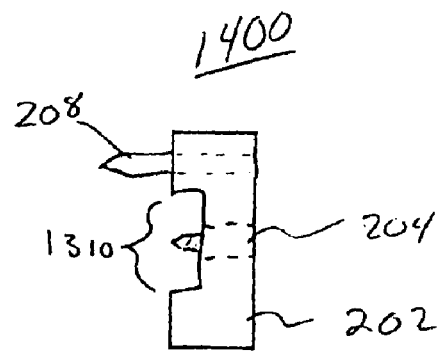
FIGS. 14A–D are views of embodiments of keyed filler panel assemblies with integrated recessed regions and locating elements in accordance with embodiments of the present claimed invention.
Figure 14B:
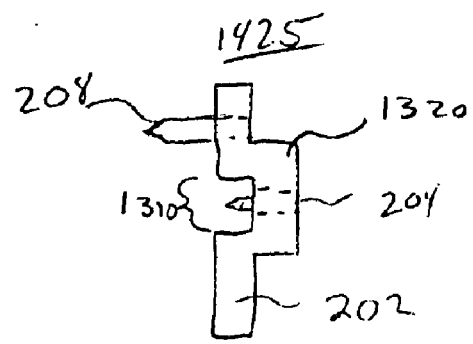
Figure 14C:
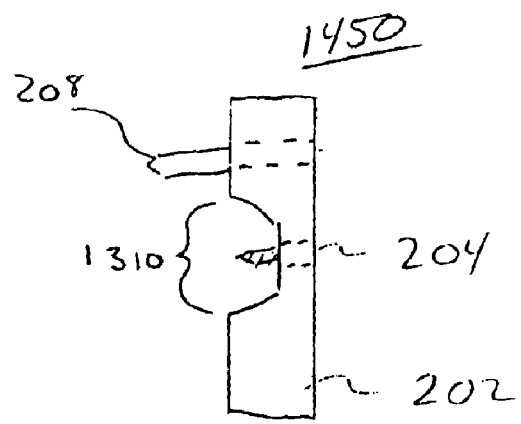
Figure 14D:
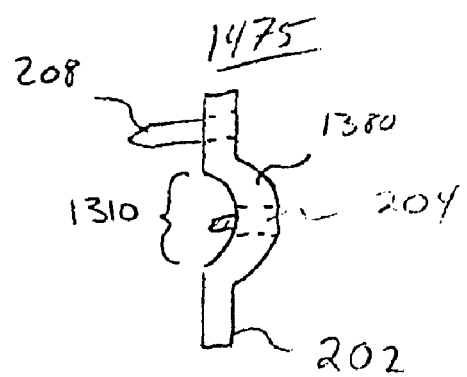

With reference now to FIG. 12, a flow chart 1200 summarizing the steps performed in accordance with one embodiment of the present invention is shown. At step 1202, the present embodiment integrates a handle element with a filler panel body 202. As described in detail above, the handle element (e.g. handle element 902, 904, 906, 908, 910, and 912 of FIGS. 9A–D) is fixedly coupled with filler panel body 202, and is adapted to provide a grasping surface above filler panel body 202 such that removably coupling filler panel body 202 from computer chassis 100 is simplified.

Next, at step 1204, the present embodiment secures the filler panel body of the keyed filler panel assembly to the chassis using an attaching device (e.g. captive screw 204 of FIG. 4). Beneficially, the present embodiment eliminates the need to pry off the filler panels removably coupled to the computer chassis. Instead, the present embodiment allows keyed filler panel assemblies to be independently decoupled from a computer chassis at any time without concern for the subsequent damage of either filler panels or chassis. Additionally, by reducing aftermarket parts and enabling simplified removal of keyed filler panel assemblies with respect to a computer chassis, the present embodiment is extremely well suited to use in hot swapping environments.

The previously mentioned filler panel with removably-coupleable airflow resistive filler card assembly is well suited to operation with or without some of the following features including the following integrated recessed region embodiment. Additionally, the present invention is well suited to operation with the integrated recessed region and/or the integrated handle and/or the previously described locating element and/or various other attachment enabling devices.

Integrated Recessed Region Physical Characteristics

With reference now to FIGS. 13A–13D, perspective views of keyed filler panels with integrated recessed regions 1310 for attaching device 204 in accordance with embodiments of the present claimed invention are shown. The following discussion will begin with a detailed description of the physical characteristics of the present keyed filler panel with integrated recessed region 1310 for attaching device 204. The discussion will then contain a detailed description of the use and operation of the present keyed filler panel with integrated recessed region 1310 for attaching device 204. In the present embodiments, keyed filler panel assemblies 1300, 1325, 1350, and 1375 include integrated recessed regions (e.g., 1310) for attaching devices (e.g., 204). Furthermore, FIGS. 13B and 13D include embodiments wherein filler panel 202 may have raised captive screw elements (e.g., 1320 and 1380). Specifically, raised captive screw elements (e.g., 1320 and 1380) are utilized in the present embodiments to reduce the amount of material required per filler panel body 202. Importantly, as will be discussed in detail below, in one embodiment, filler panel body 202 is a filler panel formed having dimensions and characteristics which are in compliance with an industry standard such as, for example, the compact peripheral component interconnect (CPCI) standard, and the VersaModular Eurocard (VME) standard.

Referring still to FIGS. 13A–D, keyed filler panel assemblies 1300, 1325, 1350, and 1375 also include and attaching device 204 which is adapted to be coupled to filler panel body 202. In one embodiment, attaching device 204 is comprised of a captive screw. Attaching device 204 is ultimately employed to removably couple filler panel body 202 to a computer chassis. Importantly, as will be discussed in detail below, in one embodiment, attaching device 204 is an attaching device 204 formed having dimensions and characteristics which are in compliance with an industry standard such as, for example, the CPCI standard, and the VME standard. Also, although a captive screw is specifically mentioned as the attaching device 204 in the present embodiment, the present invention is also well suited to use with various other types of attaching devices. However, for purposes of brevity and clarity each of the numerous possibilities of attaching devices are not shown in the present Figures.

With reference now to FIGS. 14A–14D, keyed filler panel assemblies 1400, 1425, 1450, and 1475 of the present embodiment also includes a locating element 208 which is coupled to filler panel body 202. FIG. 5A shows a side view of one embodiment of locating element 208. As shown in FIG. 5A, in one embodiment, locating element 208 is comprised of a head portion 400, and an insertion portion 402. As discussed in detail above, in one embodiment, head portion 400 is adapted to be arranged flush with filler panel body 202 of FIGS. 14A–14D. Insertion portion 402 of locating element 208 is adapted to be inserted in an opening (e.g. a mounting hole) in a computer chassis to reduce interference generating movement of filler panel body 202 of FIGS. 14A–14D with respect to the computer chassis. FIG. 5B illustrates another embodiment in which locating element 208 also includes a retention portion 404 which is coupled to head portion 400. Retention portion 404 is adapted to enhance coupling of locating element 208 and filler panel body 202 of FIGS. 14A–14D. As described in detail above, locating element 208 is adapted to orient filler panel body 202 with respect to a computer chassis such that interference generating movement of filler panel body 202 is reduced.

With reference now to FIGS. 15A–15B and 16A–16B, keyed filler panel assemblies 1500, 1530, 1600, and 1625 of the present embodiment also include an electromagnetic interference (EMI) shield portion 206 coupled to filler panel body 202. EMI shield portion 206 is employed to prevent EMI leakage from a chassis to which keyed filler panel assemblies 1500, 1530, 1600, and 1625 are ultimately coupled. In one embodiment, EMI shield portion 206 is removably coupleable with filler panel body 202. The present embodiment is also well suited to an embodiment in which EMI shield portion 206 is integral with filler panel body 202.

Integrated Recessed Region Use and Operation

The following is a detailed description of the use and operation of the present keyed filler panel with integrated recessed region 1310 for attaching device 204. With reference to FIGS. 13–16, a recessed region 1310 is integral with filler panel body 202. In general, the filler panel body with integrated recessed region 1310 for attaching device 204 is formed utilizing processes such as "extruding", "shaping", "casting", "molding", "machining", "milling", "welding", "sculpting", "compressing" or the like. Thus, in one embodiment, recessed region 1310 is fixedly coupled with filler panel body 202. Moreover, recessed region 1310 is adapted to receive an attaching device 204 for removably coupling filler panel body 202 with respect to a chassis. Generally speaking, recessed region 1310 is adapted to provide a recessed surface below filler panel body 202 such that coupling filler panel body 202 with respect to computer chassis 100 is simplified. Specifically, recessed region 1310 offers a recessed area for attaching device 204 which allows a user to ensure the face of filler panel assembly 1310 completely seats (e.g., "bottoms out") with respect to a computer chassis 100 before attaching device 204 is fastened. That is, by utilizing recessed region 1310, a user may ensure keyed filler panel with integrated recessed region for attaching device 1300 is received correctly with respect to a computer chassis 100. Additionally, FIGS. 13A–13D illustrate a multitude of possible integrated recessed regions 1310 which may be utilized with keyed filler panel 202. Although, a specific variety of possible integrated recessed region 1310 are shown, the illustrations are meant to be instructive not inclusive. Thus, it is appreciated that the present embodiment may incorporate multiple variations of integrated recessed region 1310 shapes within the scope of the present invention.

With reference now to FIGS. 14A–14D, each of the keyed filler panel assemblies (e.g., 1400, 1425, 1450, and 1475) of the present embodiment further include a locating element 208 coupled to filler panel body 202. FIGS. 14A–14D show side views of embodiments of locating element 208. With reference now to FIG. 5A, in one embodiment, locating element 208 is comprised of a head portion 400, and an insertion portion 402. As discussed in detail herein, in one embodiment, head portion 400 is adapted to be arranged flush with filler panel body 202 of FIGS. 14A–14D. In addition, insertion portion 402 of locating element 208 is adapted to be inserted in an opening (e.g. a mounting hole) in a computer chassis to reduce interference generating movement of filler panel body 202 of FIGS. 14A–14D with respect to the computer chassis 100. FIG. 5B illustrates another embodiment of the present invention in which locating element 208 also includes a retention portion 404 which is coupled to head portion 400. Retention portion 404 is adapted to enhance coupling of locating element 208 and filler panel body 202 of FIGS. 14A–14D. As described in detail herein, locating element 208 is adapted to orient filler panel body 202 with respect to a computer chassis 100 such that interference generating movement of filler panel body 202 is reduced.

Figure 15A:
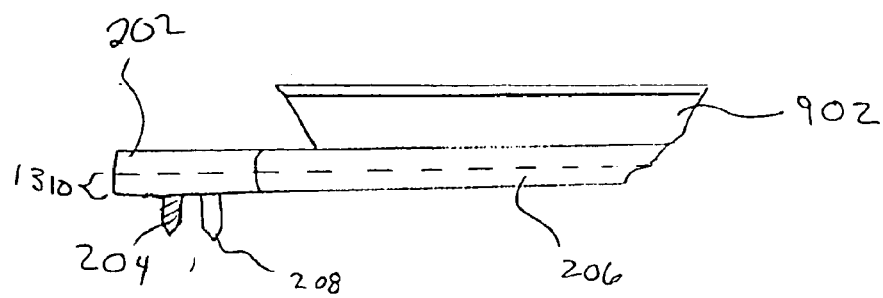
FIGS. 15A–B are views of embodiments of keyed filler panel assemblies with integrated recessed regions, locating elements, and integrated handle elements in accordance with embodiments of the present claimed invention.

With reference now to FIG. 15A, a side view 1500 of a keyed filler panel with integrated recessed region is shown. Specifically, FIG. 15A is a side view 1500 of one embodiment of a keyed filler panel with integrated recessed region 1310 for attaching device 204 which further comprises an integrated handle 902 and EMI shield portion 206. That is, in addition to the previous mentioned elements (e.g., recess portion 1310, attaching device 204, and locating element 208), side view 1500 includes a handle element 902 and EMI shield portion 206.

In general, handle element 902 is fixedly coupled with filler panel body 202 in a manner which provides a grasping surface for coupling and removably coupling filler panel body 202 with respect to a computer chassis 100. It is appreciated that handle element 902 may be any type of handle element described herein. A specific handle element 902 is described in the present embodiment merely for purposes of brevity and clarity.

In addition, EMI shield portion 206 is employed to prevent EMI leakage from a chassis to which keyed filler panel with integrated recessed region for attaching device 1500 is ultimately coupled. In one embodiment, EMI shield portion 206 is removably coupleable with filler panel body 202. The present embodiment is also well suited to an embodiment in which EMI shield portion 206 is integral with filler panel body 202.

Figure 15B:
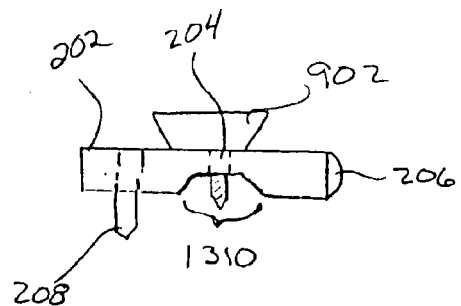

With reference now to FIG. 15B, a front view 1530 of a keyed filler panel with integrated recessed portion 1310 is shown. Specifically, FIG. 15B is an embodiment of front view 1530 showing the integration of recessed portion 1310, attaching device 204, locating element 208, handle element 902, and EMI shield portion 206. Although a specific shape of recessed portion 1310 is shown in the present embodiment, recessed portion 1310 may be of any of the previously illustrated shapes described herein. Further, recessed portion 1310 may run the entire length of filler panel body 202, or it may be found in only a portion of filler panel body 202.

Figure 16A:
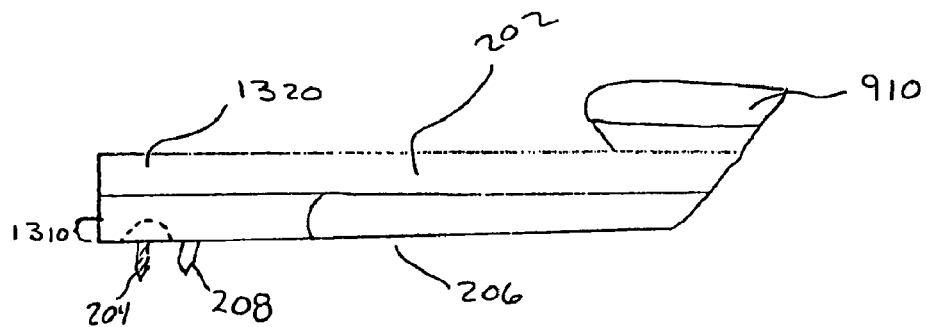
FIGS. 16A–B are views of embodiments of keyed filler panel assemblies with integrated recessed regions, locating elements, and integrated handle elements in accordance with embodiments of the present claimed invention.

With reference now to FIG. 16A, another side view 1600 of a keyed filler panel with integrated recessed portion 1310 is shown. Specifically, FIG. 16A is a side view 1600 of another embodiment of a keyed filler panel with integrated recessed portion 1310 for attaching device 204 which also comprises an integrated handle 910. That is, as stated above, side view 1600 includes recess portion 1310, attaching device 204, locating element 208, handle element 910, and EMI shield portion 206. Side view 1600 further includes raised captive screw element 1320. In general, raised captive screw element 1320 utilizes less material in conjunction with the manufacture of filler panel body 202. That is, since filler panel body 202 includes raised captive screw element 1320, a recessed portion 1310 can be formed without a need to thicken the entire wall of filler panel body 202.

In general, handle element 910 is fixedly coupled with filler panel body 202 in a manner which provides a grasping surface for coupling and removably coupling filler panel body 202 with respect to a computer chassis 100. It is appreciated that handle element 910 may be any type of handle element or a plurality of handle elements described herein. A short handle element 910 is shown merely for purposes of brevity and clarity.

In addition, EMI shield portion 206 is employed to prevent EMI leakage from a chassis to which keyed filler panel assemblies 1500 is ultimately coupled. In one embodiment, EMI shield portion 206 is removably coupleable with filler panel body 202. The present embodiment is also well suited to an embodiment in which EMI shield portion 206 is integral with filler panel body 202.

Figure 16B:
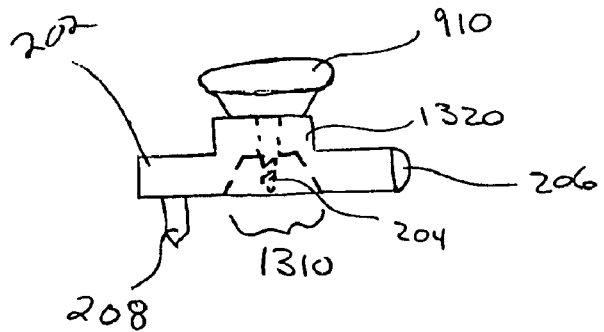

With reference now to FIG. 16B, a front view 1625 of a keyed filler panel with integrated recessed portion 1310 is shown. Specifically, FIG. 16B is an embodiment of front view 1625 showing the integration of recessed portion 1310, attaching device 204, locating element 208, handle element 902, and EMI shield portion 206. Although a specific shape of recessed portion 1310 is shown in the present embodiment, recessed portion 1310 may be of any of the previously illustrated shapes described herein. Further, recessed portion 1310 may run the entire length of filler panel body 202, or it may be found in only a portion of filler panel body 202.

Figure 17:
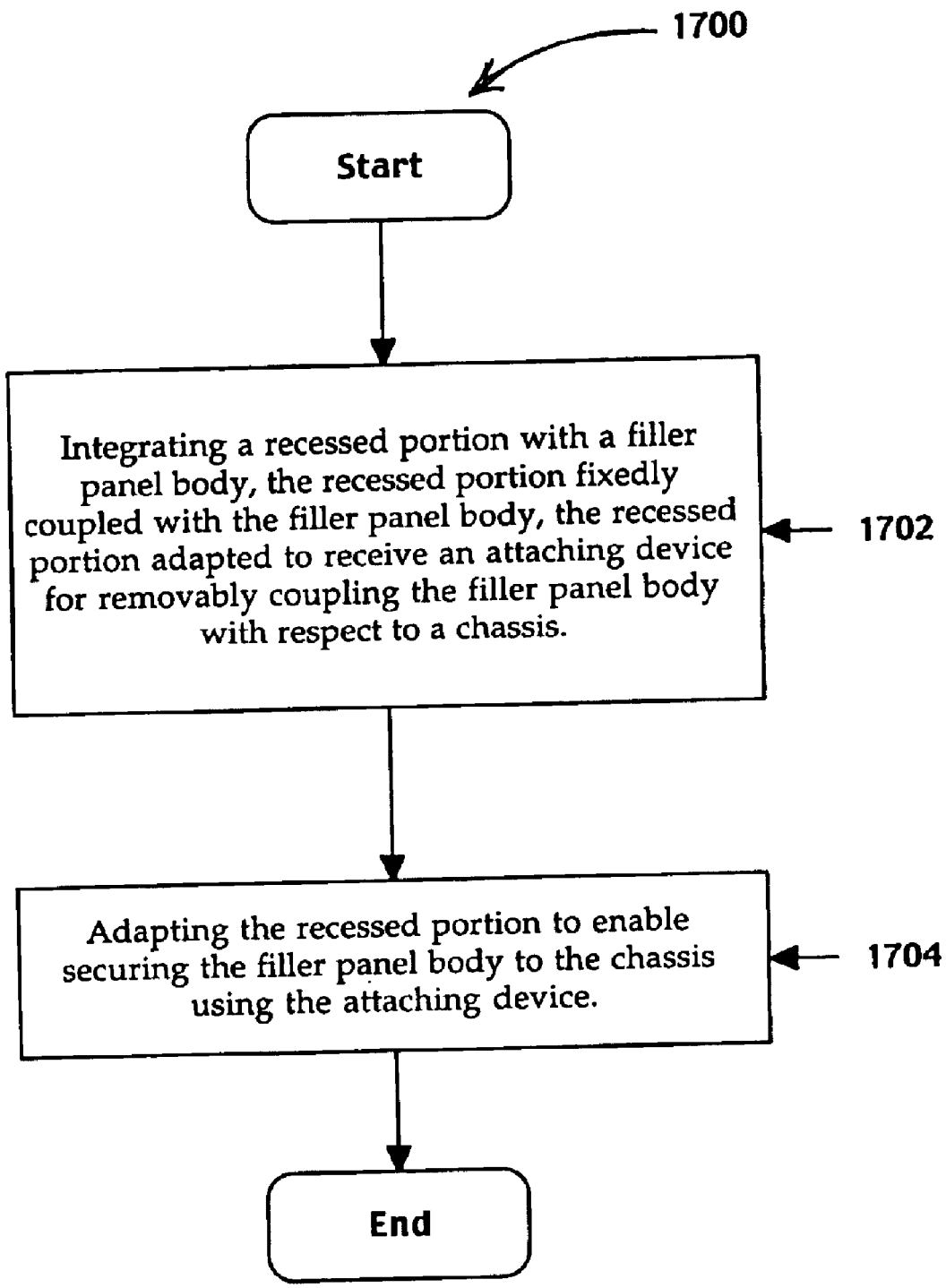
FIG. 17 is a flow chart of steps performed in accordance with one embodiment of the present claimed invention.

With reference now to FIG. 17, a flow chart 1700 summarizing the steps performed in accordance with one embodiment of the present invention is shown. At step 1702, the present embodiment integrates a recessed portion 1310 with a filler panel body 202. As described in detail above, the recessed portion 1310 is fixedly coupled with said filler panel body 202, and is adapted to receive an attaching device (e.g., 204) for removably coupling the filler panel body 202 with respect to a chassis (e.g., computer chassis 100).

Next, at step 1704, the present embodiment secures the filler panel body 202 to the chassis (e.g., computer chassis 100) using an attaching device (e.g. captive screw 204) adapted for use with recessed portion 1310. Beneficially, the present embodiment eliminates the need for multiple parts for mounting attaching device (e.g., captive screw 204) to filler panel body 202. Additionally, by reducing the amount of parts required for a filler panel body 202, or the thickness thereof, the present embodiment reduces associated manufacturing and assembly costs as well as post machining requirements.

Thus, the present invention provides a method and apparatus for a keyed filler panel with removably-coupleable airflow resistive filler card assembly which reduces uneven airflow issues of empty PCA slots with respect to a chassis. The present invention also provides a method and apparatus for a keyed filler panel with removably-coupleable airflow resistive filler card assembly which reduces manufacturing and assembly costs. The present invention also provides a method and apparatus for a keyed filler panel with removably-coupleable airflow resistive filler card assembly which achieves the above accomplishment and which facilitates hot swapping of PCA cards. The present invention also provides a method and apparatus for a keyed filler panel with removably-coupleable airflow resistive filler card assembly which achieves the above accomplishments and which can be adapted to readily interface with industry standard components and meet industry standard specifications.

The foregoing descriptions of specific embodiments of the present invention have been presented for purposes of illustration and description. They are not intended to be exhaustive or to limit the invention to the precise forms disclosed, and modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A keyed filler panel with removably-coupleable airflow resistive filler card assembly comprising:
   a filler panel body; and
   an airflow resistive filler portion removably-coupleable with said filler panel body, said airflow resistive filler portion adapted to couple with said filler panel body without additional panel coupling hardware, wherein said airflow resistive filler portion is comprised of:
   a face portion;
   a guide portion coupled with said face portion, said guide portion adapted to be coupled with respect to a chassis such that interference generating movement of said airflow resistive filler portion with respect to said chassis is reduced; and
   a connective portion coupled with said face portion, said connective portion adapted to be coupled with said filler panel body without additional hardware.

2. The keyed filler panel with removably-coupleable airflow resistive filler card assembly of claim 1 wherein said connective portion further comprises:
   punch details coupled with said connective portion, said punch details adapted to align with punch details coupled with said filler panel body to reduce misalignment of said connective portion with respect to said filler panel body.

3. The keyed filler panel with removably-coupleable airflow resistive filler card assembly of claim 1 wherein said airflow resistive filler portion is snapped onto said filler panel body.

4. The keyed filler panel with removably-coupleable airflow resistive filler card assembly of claim 1 further comprising:
   an electromagnetic interference (EMI) shield portion coupled with said filler panel body, said EMI shield portion adapted to prevent EMI leakage from said chassis.

5. The keyed filler panel with removably-coupleable airflow resistive filler card assembly of claim 1 wherein said airflow resistive filler portion is coupled with said filler panel body in accordance with a compact peripheral component interconnect (CPCI) standard.

6. The keyed filler panel with removably-coupleable airflow resistive filler card assembly of claim 1 wherein said airflow resistive filler portion is coupled with said filler panel body in accordance with a VersaModular Eurocard (VME) standard.

7. The keyed filler panel with removably-coupleable airflow resistive filler card assembly of claim 1 wherein said filler panel body further comprises:
   a handle element fixedly coupled with said filler panel body, said handle element being disposed above said filler panel body in a manner which provides a grasping surface for removably coupling said filler panel body with respect to said chassis.

8. The keyed filler panel with removably-coupleable airflow resistive filler card assembly of claim 1 wherein said filler panel body further comprises:
   a locating element coupled with said filler panel body, said locating element adapted to orient said filler panel body with respect to said chassis such that interference generating movement of said filler panel body is reduced.

9. The keyed filler panel with removably-coupleable airflow resistive filler card assembly of claim 1 wherein said filler panel body further comprises:
   a recessed portion integral with said filler panel body, said recessed portion fixedly coupled with said filler panel body, said recessed portion adapted to receive an attaching device for removably coupling said filler panel body with respect to a chassis.

10. A method for reducing uneven airflow respect to a chassis comprising:
   a) removeably-coupling an airflow resistive filler portion with said filler panel body, said airflow resistive filler portion adapted to couple with said filler panel body without additional hardware; (and)
   b) providing an attaching device, said attaching device adapted to enable securing said airflow resistive filler portion removably-coupleable with said filler panel body to said chassis; and
   c) fixedly coupling a handle element with said filler panel body, said handle element being disposed above said filler panel body in a manner which provides a grasping surface for removably coupling said filler panel body with respect to said chassis.

11. The method for reducing uneven airflow with respect to a chassis as recited in claim 10 wherein said step a) comprises snapping said airflow resistive filler portion into place on said filler panel body.

12. The method for reducing uneven airflow with respect to a chassis as recited in claim 10 step a) wherein said airflow resistive filler portion is adapted to enable securing said filler panel body with said chassis in accordance with the group consisting of compact peripheral component interconnect (CPCI) standard and VersaModular Eurocard (VME) standard.

13. The method for reducing uneven airflow with respect to a chassis as recited in claim 10 further comprising:
   c) coupling a locating element with said filler panel body, said locating element adapted to orient said filler panel body with respect to said chassis such that interference generating movement of said filler panel body is reduced.

14. The method for reducing uneven airflow with respect to a chassis as recited in claim 10 further comprising:
   c) integrating a recessed portion with said filler panel body, said recessed portion fixedly coupled with said filler panel body, said recessed portion adapted to receive an attaching device for removably coupling said filler panel body with respect to a chassis.

15. A keyed filler panel with removably-coupleable airflow resistive filler card assembly comprising:
   a filler panel body;
   an airflow resistive filler portion removably-coupleable with said filler panel body, said airflow resistive filler portion adapted to couple with said filler panel body without additional hardware;
   a handle element fixedly coupled with said filler panel body, said handle element being disposed above said filler panel body in a manner which provides a grasping surface for removably coupling said filler panel body with respect to said chassis;
   a locating element coupled with said filler panel body, said locating element adapted to orient said filler panel body with respect to said chassis such that interference generating movement of said filler panel body is reduced; and
   a recessed portion integral with said filler panel body, said recessed portion adapted to receive an attaching device for removably coupling said filler panel body with respect to a chassis.

16. The keyed filler panel with removably-coupleable airflow resistive filler card assembly of claim 15, wherein said airflow resistive filler portion is comprised of:
   a panel portion;
   a guide portion coupled with said panel portion, said guide portion adapted to be inserted with respect to a chassis such that interference generating movement of said airflow resistive filler portion with respect to said chassis is reduced; and
   an insertion portion coupled with said panel portion, said insertion portion adapted to be coupled with said filler panel body without additional hardware.

17. The keyed filler panel with removably-coupleable airflow resistive filler card assembly of claim 16 wherein said insertion portion further comprises:
   punch details coupled with said insertion portion, said punch details adapted to align with punch details on said filler panel body to reduce misalignment of said insertion portion with respect to said filler panel body.

18. The keyed filler panel with removably-coupleable airflow resistive filler card assembly of claim 15, said airflow resistive filler portion is clipped onto said filler panel body.

19. The keyed filler panel with removably-coupleable airflow resistive filler card assembly of claim 15 further comprising:
   an electromagnetic interference (EMI) shield portion coupled with said filler panel body, said EMI shield portion adapted to prevent EMI leakage from said chassis.

20. The keyed filler panel with removably-coupleable airflow resistive filler card assembly of claim 15 wherein said airflow resistive filler portion is coupled with said filler panel body in accordance with a VersaModular Eurocard (VME) standard.

21. The keyed filler panel with removably-coupleable airflow resistive filler card assembly of claim 15 wherein said airflow resistive filler portion is coupled with said filler panel body in accordance with a compact peripheral component interconnect (CPCI) standard.

* * * * *